(12) United States Patent
Tallam et al.

(10) Patent No.: US 10,955,489 B2
(45) Date of Patent: Mar. 23, 2021

(54) SYSTEM AND METHOD FOR GROUND FAULT DETECTION

(71) Applicant: Rockwell Automation Technologies, Inc., Mayfield Heights, OH (US)

(72) Inventors: Rangarajan M. Tallam, Mequon, WI (US); Jiangang Hu, Mequon, WI (US); Brian P. Brown, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/601,959

(22) Filed: Oct. 15, 2019

(65) Prior Publication Data

US 2020/0041559 A1 Feb. 6, 2020

Related U.S. Application Data

(63) Continuation of application No. 15/409,919, filed on Jan. 19, 2017, now Pat. No. 10,564,207, which is a
(Continued)

(51) Int. Cl.
| | |
|---|---|
| *G01R 27/18* | (2006.01) |
| *G01R 31/50* | (2020.01) |
| *H02M 5/458* | (2006.01) |
| *G01R 31/40* | (2020.01) |
| *B60L 3/12* | (2006.01) |
| *H02H 3/16* | (2006.01) |
| *B60L 3/00* | (2019.01) |
| *B60L 3/04* | (2006.01) |
| *H02H 7/12* | (2006.01) |

(52) U.S. Cl.
CPC ............ *G01R 31/50* (2020.01); *B60L 3/0069* (2013.01); *B60L 3/04* (2013.01); *B60L 3/12* (2013.01); *G01R 31/40* (2013.01); *H02H 3/16* (2013.01); *H02M 5/458* (2013.01); *B60L 2220/42* (2013.01); *H02H 7/1216* (2013.01); *Y02T 10/64* (2013.01)

(58) Field of Classification Search
CPC .... G01R 31/025; G01R 31/086; G01R 31/40; B60L 3/0069; B60L 3/04; B60L 3/12; B60L 2220/42; H02H 3/16; H02H 7/1216; Y02T 10/646
USPC ......................................................... 324/509
See application file for complete search history.

(56) References Cited

U.S. PATENT DOCUMENTS

| | | |
|---|---|---|
| 4,371,832 A | 2/1983 | Wilson et al. |
| 5,909,367 A | 6/1999 | Change |

(Continued)

FOREIGN PATENT DOCUMENTS

| | | |
|---|---|---|
| CN | 102169155 A | 8/2011 |
| CN | 102645607 A | 8/2012 |

(Continued)

*Primary Examiner* — Melissa J Koval
*Assistant Examiner* — Courtney G McDonnough
(74) *Attorney, Agent, or Firm* — Fay Sharpe LLP

(57) ABSTRACT

Power conversion systems, disclosed examples include power conversion systems, ground fault detection apparatus and methods to detect and identify ground faults in a power conversion system using AC coupling to sense a system voltage to determine a leakage flux linkage, and to identify a faulted converter phase based on a phase shift angle of the leakage flux linkage.

8 Claims, 19 Drawing Sheets

Related U.S. Application Data continuation-in-part of application No. 14/048,156, filed on Oct. 8, 2013, now Pat. No. 9,684,026, and a continuation-in-part of application No. 14/296,502, filed on Jun. 5, 2014, now Pat. No. 9,604,543.

(60) Provisional application No. 62/440,910, filed on Dec. 30, 2016.

(56) References Cited

U.S. PATENT DOCUMENTS

| | | |
|---|---|---|
| 6,348,800 B1 | 2/2002 | Haensgen et al. |
| 6,984,988 B2 | 1/2006 | Yamamoto |
| 7,102,355 B1 | 9/2006 | Kumar |
| 7,498,819 B2 | 3/2009 | Kumar |
| 7,751,993 B2 | 7/2010 | Mirafzal |
| 7,933,108 B2 | 4/2011 | Tallam |
| 8,149,551 B2 | 4/2012 | Vedula |
| 8,319,466 B2 | 11/2012 | Valdez et al. |
| 8,478,552 B2 | 7/2013 | Morita et al. |
| 2009/0154034 A1 | 6/2009 | Tallam |
| 2010/0259099 A1 | 10/2010 | Vedula et al. |
| 2011/0153234 A1 | 6/2011 | Winterhalter et al. |
| 2011/0175619 A1 | 7/2011 | Bauer et al. |
| 2011/0254630 A1* | 10/2011 | Acar .............. H03F 1/0277 330/296 |
| 2012/0086458 A1 | 4/2012 | Wei et al. |
| 2012/0112757 A1 | 5/2012 | Vrankovic et al. |
| 2012/0249038 A1 | 10/2012 | Wei et al. |
| 2013/0218491 A1 | 8/2013 | Wei et al. |
| 2014/0132278 A1* | 5/2014 | Tang .............. G01R 31/007 324/509 |
| 2015/0097571 A1 | 4/2015 | Wei |
| 2015/0188445 A1 | 7/2015 | Tsutsui et al. |
| 2015/0355262 A1 | 12/2015 | Hu et al. |

FOREIGN PATENT DOCUMENTS

| | | |
|---|---|---|
| EP | 1914557 A2 | 4/2008 |
| EP | 2439827 A2 | 4/2012 |

* cited by examiner

SYSTEM AND METHOD FOR GROUND FAULT DETECTION

CROSS-REFERENCE TO RELATED APPLICATIONS

This application is a continuation of, and claims priority to and the benefit of, U.S. patent application Ser. No. 15/409,919, filed on Jan. 19, 2017, entitled SYSTEM AND METHOD FOR GROUND FAULT DETECTION, the disclosure of which is hereby fully incorporated by reference in its entirety.

U.S. patent application Ser. No. 15/409,919 is a continuation-in-part of, and claims priority to and the benefit of, U.S. patent application Ser. No. 14/048,156, now U.S. Pat. No. 9,684,026, filed on Oct. 8, 2013, entitled APPARATUS AND METHOD FOR AUTOMATIC GROUND FAULT LOCATION DETERMINATION IN HIGH RESISTANCE GROUNDED MOTOR DRIVE SYSTEM, the disclosure of which is hereby fully incorporated by reference in its entirety.

U.S. patent application Ser. No. 15/409,919 is a continuation-in-part of, and claims priority to and the benefit of, U.S. patent application Ser. No. 14/296,502, now U.S. Pat. No. 9,604,543, filed on Jun. 5, 2014, entitled APPARATUS AND METHOD FOR AUTOMATIC GROUND FAULT LOCATION DETERMINATION IN HIGH RESISTANCE GROUNDED MOTOR DRIVE SYSTEM, the disclosure of which is hereby fully incorporated by reference in its entirety.

U.S. patent application Ser. No. 15/409,919 claims priority to, and the benefit of, U.S. Provisional Patent Application No. 62/440,910, filed on Dec. 30, 2016, entitled SYSTEM AND METHOD FOR GROUND FAULT DETECTION, the disclosure of which is hereby fully incorporated by reference in its entirety.

BACKGROUND INFORMATION

The subject matter disclosed herein relates to power conversion systems.

BRIEF DESCRIPTION

Disclosed examples include power conversion systems, ground fault detection apparatus and methods to detect and identify ground faults in a power conversion system.

DETAILED DESCRIPTION

Figure 1:
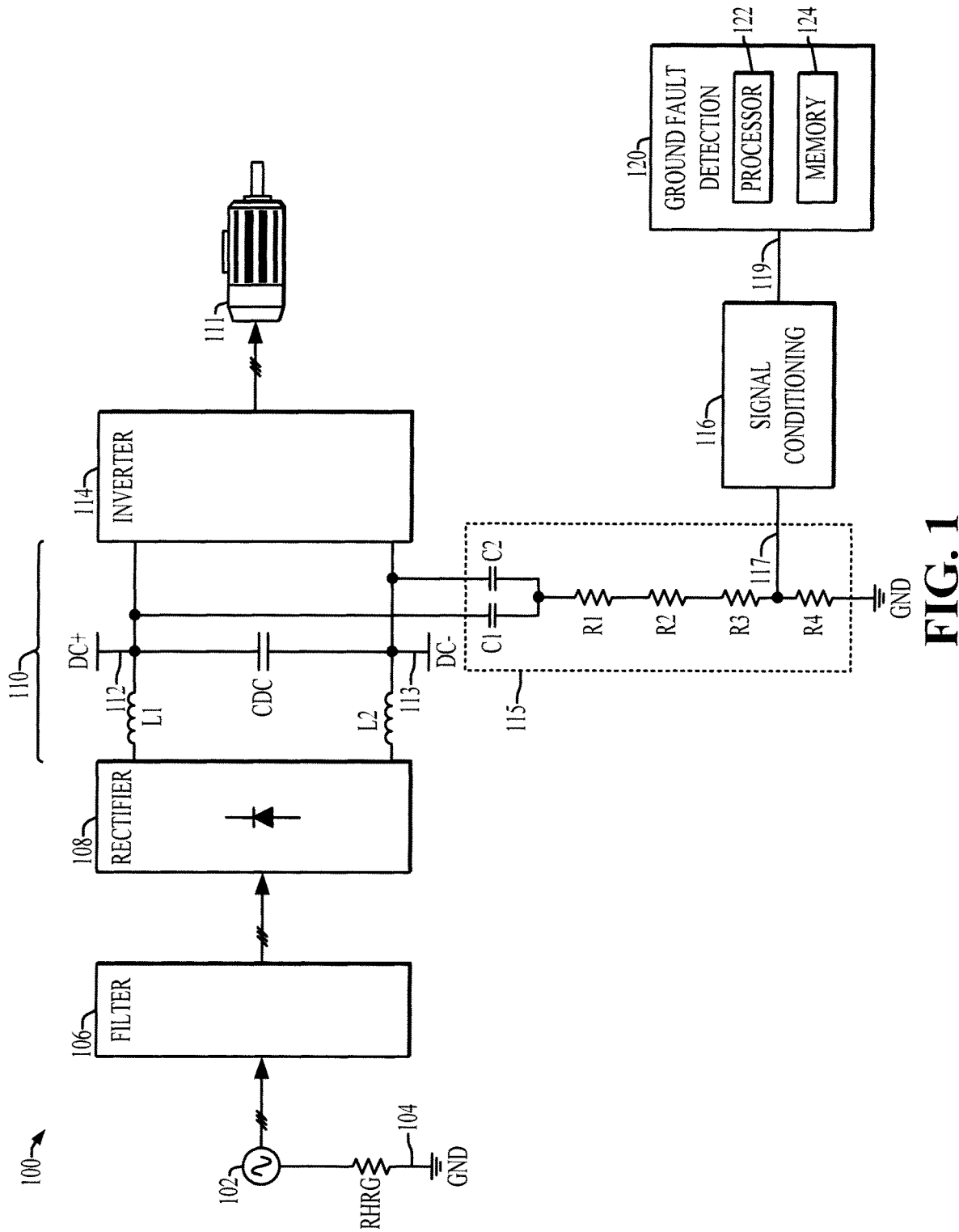
FIG. 1 is a schematic diagram of a power conversion system with a capacitively coupled sensing circuit, a signal conditioning circuit, and a ground fault detection system.
Figure 2:
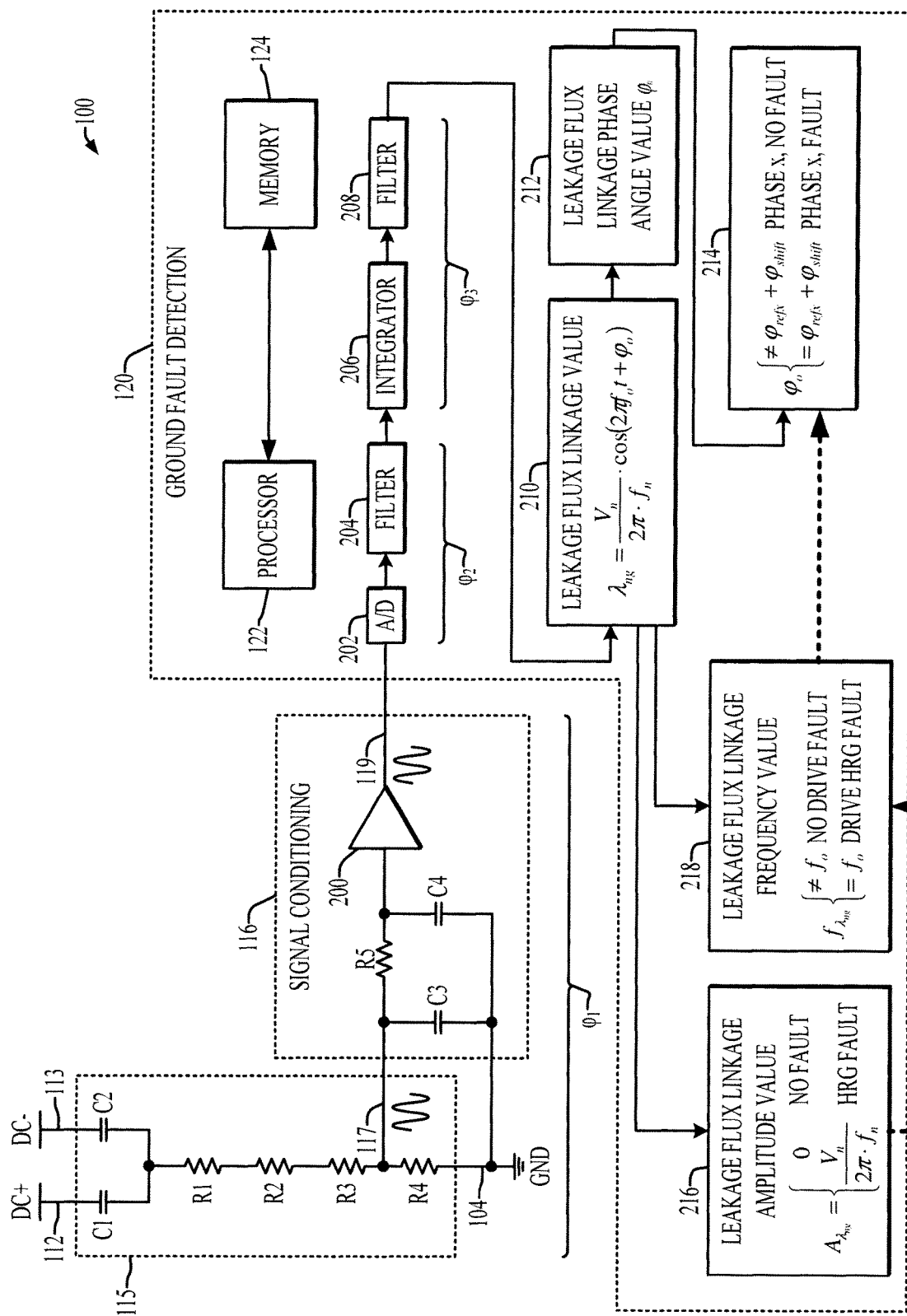
FIG. 2 is a schematic diagram illustrating further details of an example ground fault detection system in the power converter of FIG. 1.

Referring initially to FIGS. 1 and 2, FIG. 1 illustrates a power conversion system 100 that receives AC input power from a single or multiphase power source 102 and provides AC output power to drive a motor load 111. FIG. 2 shows further details of an example ground fault detection system in the power converter 100 of FIG. 1. The system 100 includes a rectifier 108 with an AC input to the receive AC input power from the source 102, and a DC output to provide a DC output signal to a DC bus circuit 110. In the illustrated example, a filter circuit 106 (e.g., single or multiphase LC or LCL filter circuit in certain examples) is connected between the phase lines of the input source 102 and the AC input of the rectifier circuit 108. In other possible implementations, the filter circuit 106 can be omitted. The AC input source 102 is referenced to a ground or other reference node 104 (indicated as GND in the drawings). The ground reference node 104 can be, for example, coupled with a neutral node of a Y-connected input source 102 through a high resistance ground (HRG) resistor RHRG, where the source 102 can in certain examples include a transformer with a Y-connected primary or secondary including a neutral node to form the ground reference node 104 for the power conversion system 100. In certain examples, the reference node 104 is connected to a chassis (not shown) of the motor drive power converter 100. The power conversion system 100 also includes an output inverter 114 with a DC input that receives DC input power from the DC bus circuit 110, and a single or multiphase AC output to provide AC output power to drive a load 111. In certain field applications, a transformer and/or output filter may be connected between the output of the inverter 114 and the driven motor load 111.

The DC bus circuit 110 includes first and second DC bus terminals 112 and 113, respectively, and one or more DC bus capacitors illustrated in FIG. 1 as a capacitor CDC connected between the bus terminals 112 and 113. The DC bus circuit 110 can also include one or more series connected DC link chokes or inductors L1 and L2 between the rectifier output and the DC bus terminals 112 and 113. In this example, the first DC bus terminal 112 provides a positive DC voltage (DC+) relative to the voltage (DC−) of the second DC bus node 113. The DC bus terminals 112 and 113 are individually coupled between the rectifier DC output and the inverter DC input.

In operation, the rectifier 108 provides a DC output voltage between the DC bus terminals 112 and 113 to provide a controlled DC bus voltage VDC at the DC input of the inverter 114. The rectifier 108 can be a passive rectifier circuit, or can be an active front end rectifier with a plurality of switching devices individually connected between the corresponding rectifier AC input terminals and a corresponding one of the DC bus terminals 112, 113. The inverter 114 includes a plurality of inverter switching devices (not shown) individually coupled between a corresponding one of the DC bus terminals 112, 113 and a corresponding one of the AC output lines. The inverter 114 selectively activates the inverter switching devices in order to convert DC input power from the DC bus circuit 110 to provide variable frequency, variable amplitude AC output voltages and corresponding currents to drive a motor load 111. Although illustrated and described in connection with a motor drive type system 100, the concepts of the present disclosure can be applied in other power conversion systems having a DC bus circuit with a conditioning capacitor.

The presently disclosed examples facilitate detection and/or identification of high resistance ground faults in power conversion systems that include one or more power converters, such as motor drives. US patent application publication 2015/0097571 describes apparatus and methods for automatic ground fault location determinations in high resistance grounded motor drive systems, the entirety of which is hereby incorporated by reference. US patent application publication 2015/0355262 describes method and apparatus for identifying ground fault locations in a multi-drive system based on an identified fault signal frequency, the entirety of which is hereby incorporated by reference. Marine standards for motor drives or other power conversion systems require DC isolation of 100 megohms resistance or more from high-voltage to ground. Accordingly, a neutral or other system voltage cannot be sensed with respect to ground using resistive divider's, as these are typically one or two orders of magnitude lower in resistance than the required 100 megohms corresponding to the Marine standards. Other solutions using resistive dividers connected to a neutral or other high voltage circuit node can create leakage current to ground with typical resistance values to ground in the range of 1-2 MΩ. Moreover, IEC electrical safety standards often call for routine dielectric voltage withstand testing (e.g., high potential or "hi-pot" testing), and Marine regulatory standards require that products have DC resistance between HV nodes and ground exceeding 100 MΩ), when measured with a test voltage of 500 VDC. Resistive sensing solutions often use a means (e.g., a jumper) to disconnect the resistive divider sensing string during testing.

The present disclosure provides AC coupled sensing circuitry 115 including one or more capacitors C1, C2 individually connected to the positive and negative DC bus terminals 112, 113 as shown in FIG. 1. The DC blocking capacitor or capacitor C1, C2 allow sensing of neutral-ground voltage Vng and subsequent analysis for identifying and detecting HRG ground faults in the system 100, while blocking DC to reduce DC leakage current and satisfy the requirements of the Marine standards. In this regard, in certain embodiments, only the AC component of the sensed voltage is required to detect a ground fault, and blocking the DC facilitate satisfaction of the Marine standards while allowing use of any suitable algorithm for ground fault detection and ground fault source identification in disclosed examples. This aspect of the presently disclosed examples provides a low cost, low size solution that is adaptable for use in any subsequent signal analysis, with controlled high noise immunity. Disclosed example modify the resistor divider network using one or more DC blocking capacitors C1, C2 such that the sensing circuitry presents a very high resistance to DC, and does not require a jumper to disconnect the network from ground for production dielectric withstand testing.

The example of FIGS. 1 and 2 includes HV rated DC blocking capacitors (e.g., single digit nF capacitance in one example) which present >>100 MΩ of resistance to DC. Advantageously, the sensing circuit 115 does not have to be disconnected from ground for dielectric voltage withstand test as the capacitors C1 and C2 in certain examples are rated for high voltage (e.g., 3-6 KV ceramic capacitors of single digit nF capacitance values, such as 2500 V rated capacitors. Electrolytic capacitors can be used, but ceramic capacitors typically provide better (e.g., higher) leakage resistance characteristics. Suitable capacitors C1, C2 provide low DC leakage current and high DC resistance. In certain examples, moreover, a subsequently used ground fault detection/identification algorithm(s) is not affected by the frequency response of sensing circuit 115. The illustrated example includes two or more resistors to provide a resistive voltage divider circuit, where the illustrated example includes resistors R1, R2, R3 and R4 connected in series with one another between the joining node of the capacitors C1, C2 and the ground reference node 104 (GND). In this example, the capacitor C1 is connected between the DC+ node 112 and the joining node at the upper terminal of R1, and the capacitor C2 is connected between the DC− bus terminal 113 and the joining node. In other examples, one of the capacitors C1 or C2 can be omitted (e.g., only one sensing capacitor is required in certain embodiments). In other examples, one or more AC coupling (DC blocking) capacitors can be connected between the resistive divider circuitry and another node associated with the DC bus circuit 110 (e.g., a neutral node connected by capacitors between the positive and negative DC bus terminals 112, 113, etc.). The resistive divider circuit in the illustrated example provides a divider output node 117 that delivers a low voltage signal to a signal conditioning circuit. In one example, the individual divider resistors R1-R4 provide a total series resistance of 1-2 megohms, although any suitable values can be used. Moreover, the resistive divider circuitry R1-R4 provides a step down voltage division suitable for delivering an input signal (e.g., an AC voltage signal of +/−5 V) that can be processed by the signal conditioning circuit 116. In this regard, the use of the blocking capacitor(s) facilitates use of a resistor string of sufficiently low impedance to facilitate high noise immunity for voltage feedback.

Figure 3A:
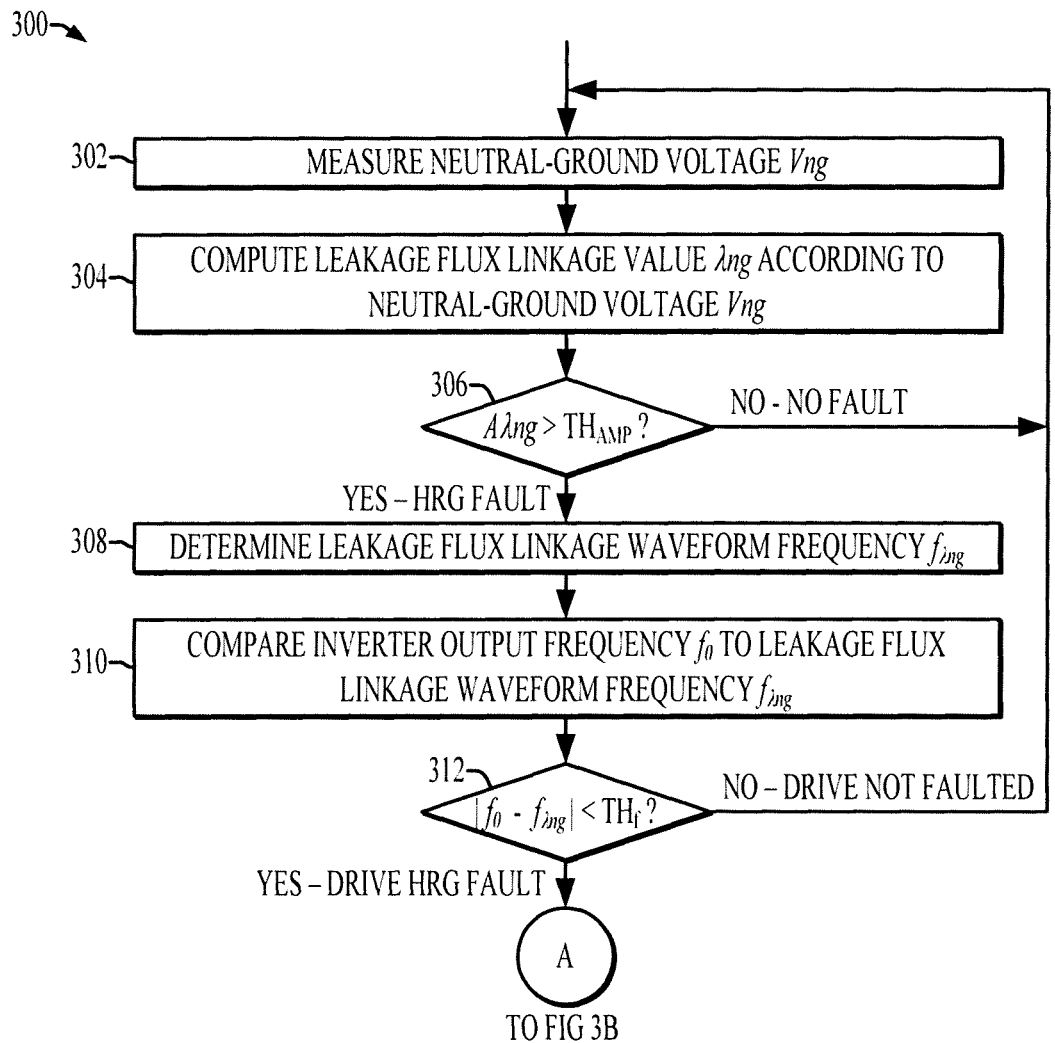
FIGS. 3A and 3B provide a flow diagram illustrating a method of detecting and identifying high resistance ground (HRG) faults in the system of FIG. 1.
Figure 3B:
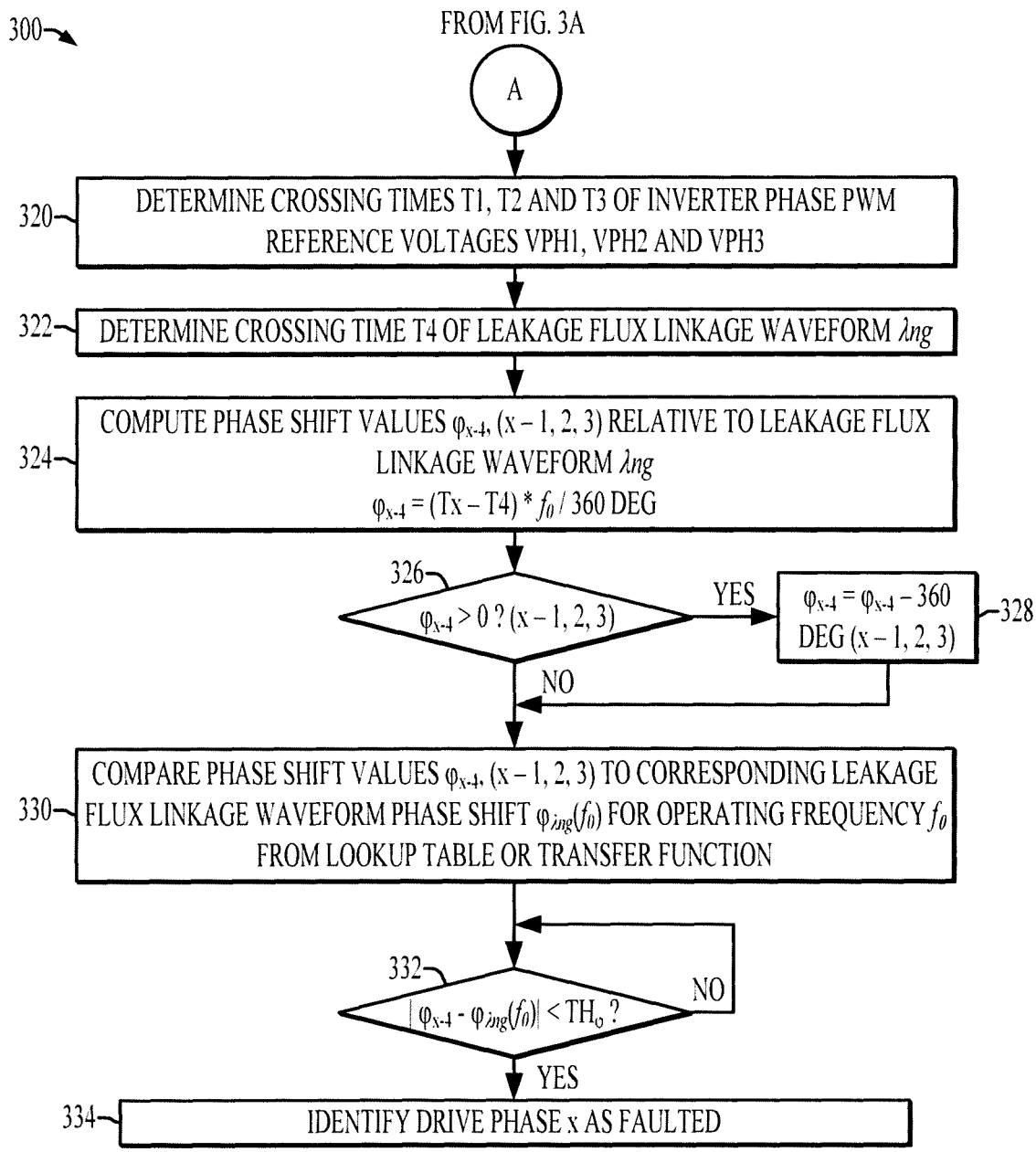

Referring also to FIGS. 2, 3A and 3B, the signal conditioning circuit includes an output 119 (e.g., single ended or differential) to deliver a conditioned signal to a ground fault detection system 120. As seen in FIGS. 1 and 2, one example of the ground fault detection system 120 includes a processor 122 and an associated electronic memory 124. The processor 122 in one example uses program instructions stored in the memory 124 in order to implement one or more of the described processes to detect and identify ground faults in the system 100, and the processor 122 can further implement other program instructions to implement motor drive or other power conversion control functions in the system 100. A flow diagram 300 in FIGS. 3A and 3B illustrates a method 300 of detecting and identifying high resistance ground (HRG) faults in the system of FIG. 1. In certain examples, the processor 122 of the ground fault detection system 120 executes instructions from the memory 124 in order to implement the process 300.

The signal conditioning circuit 116 in one example provides a signal on the output node 119 representing the sensed neutral-ground voltage $V_{ng}$. The system 120 includes an analog-to-digital (A/D) converter circuit 202 which provides a digital value to a first filter circuit 204 (e.g., a high pass filter in one example). The filtered output from the first filter circuit 204 is provided to an integrator component 206, and the integrator output is provided to a second filter component 208. The output of the second filter 208 is used as an input to one or more algorithms implemented by components 210, 212, 214, 216 and 218 of the ground fault detection system 120. In one example, the components 204-218 are implemented by memory instructions executed by the processor 122. In the example of FIG. 2, moreover, the signal conditioning circuitry 116 includes a capacitor C3 connected between the divider output node 117 and the ground reference node 104, as well as a further R-C low-pass filter circuit formed by a resistor R5 and a capacitor C4. The signal conditioning circuit 116 in this example also includes an amplifier circuit 200 (e.g., single-ended or differential) that provides an AC output signal to the output node 119.

At 302 in FIG. 3A, the ground fault detection system 120 measures the neutral-ground voltage $V_{ng}$. The leakage flux linkage $\lambda_{ng}$ is computed at 304 in FIG. 3A based at least partially on the sensed neutral to the ground voltage $V_{ng}$. Disclosed embodiments can use the components 210 and 216 to determine the amplitude $A\lambda_{ng}$ of the leakage flux linkage signal waveform $\lambda_{ng}$ according to the measured neutral-ground voltage signal $V_{ng}$ and to use the amplitude $A\lambda_{ng}$ to determine at 306 whether there is an HRG ground fault in a single or multi-drive system that includes the illustrated power conversion system 100 of FIG. 1. In the illustrated example, if the amplitude $A\lambda_{ng}$ exceeds an amplitude threshold $TH_{AMP}$ (YES at 306), the system 120 determines that there is an HRG fault in the system. Otherwise (NO at 306), the process 300 returns to 302 as described above (no fault is detected). Once a fault has been determined (YES at 306), the process 300 continues at 308 where the system 120 (leakage flux linkage frequency value component 218) determines the leakage flux linkage waveform frequency $f_{\lambda ng}$. At 310, the component 218 compares the inverter output frequency $f_o$ with the leakage flux linkage waveform frequency $f_{\lambda ng}$. In one example, the processor 122 computes the difference between the inverter frequency and the leakage flux linkage frequency, and compares the absolute value of the difference with a frequency threshold value $TH_f$ at 312 in FIG. 3A. If the absolute value of the difference is greater than or equal to the threshold (NO at 312), the system 120 determines that the host drive (corresponding to the inverter output frequency $f_o$) is not the source of the detected fault, and the process returns to 302 as described above. Otherwise (YES at 312), the system 120 determines that the host drive system 100 is operating sufficiently close to the leakage flux linkage waveform frequency $f_{\lambda ng}$, and thus determines that the host drive is the source of the HRG fault.

Continuing with the process 300 in FIG. 3B, the inventors have appreciated that the phase angle of $\lambda_{ng}$ contains the phase shift information of $V_{ng}$ due to the hardware and software filtering and integration provided by the components 204, 206 and 208. As seen in FIG. 2, the sensing circuitry 115 and the signal conditioning circuitry 116 contribute a first phase shift amount $\varphi_1$, the A/D converter circuit 202 and the first filter circuit 204 contribute a second phase shift amount $\varphi_1$, and the integrator component 206 and the second filter component 208 contribute a third phase shift amount $\varphi_1$. At 320 in FIG. 3B, the system 120 determines crossing times T1, T2 and T3 of the corresponding inverter phase PWM reference voltages VPH1, VPH2 and VPH3, and determines the crossing time T4 of the leakage flux linkage waveform at 322. The system 120 uses these values T1-T4 at 324 to compute phase shift values $\varphi_{1-4}$, $\varphi_{2-4}$ and $\varphi_{3-4}$ (collectively $\varphi_{1-4}$, where x=1, 2, 3) representing the relative phase shift of the voltage waveforms VPH1, VPH2 and VPH3 to the leakage flux linkage waveform $\lambda_{ng}$. At 326, the system 120 determines whether any of the individual phase shift values $\varphi_{x-4}$ is positive, and if so adjusts the value by 360° at 328. Thereafter, the system 120 compares the phase shift values $\varphi_{x-4}$ to corresponding frequency correlated leakage flux linkage waveform phase shift values $\varphi_{\lambda ng}(f_o)$ at 330, where the phase shift values $\varphi_{\lambda ng}(f_o)$ can be obtained from a lookup table or computed according to a known transfer function, or otherwise made available to the system 120. At 332, the fault identification component 214 of the system 120 determines whether the absolute value of the difference between the values $\varphi_{x-4}$ and the corresponding phase shift value $\varphi_{\lambda ng}(f_o)$ is less than a phase shift threshold $TH_\varphi$. If not (NO at 332), the component 214 proceeds to the next phase shift value $\varphi_{x-4}$. Once the component 214 identifies the corresponding phase at which the leakage flux linkage phase shift value is closest to the corresponding phase voltage phase shift value (YES at 332), the corresponding drive phase "x" is identified as being faulted at 334.

Figure 4:
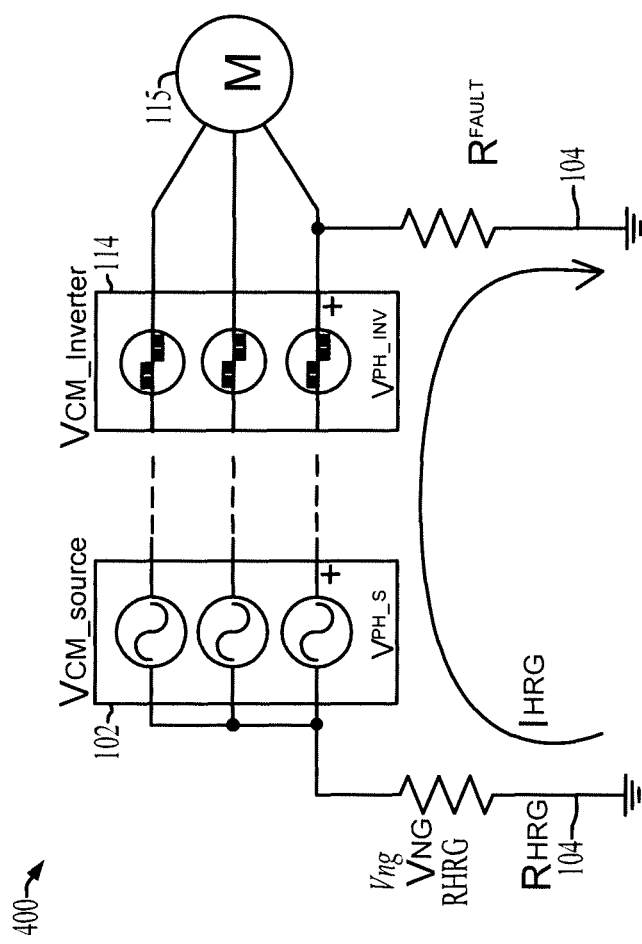
FIG. 4 is a schematic diagram illustrating fault current flow in a HRG fault condition.
Figure 5:
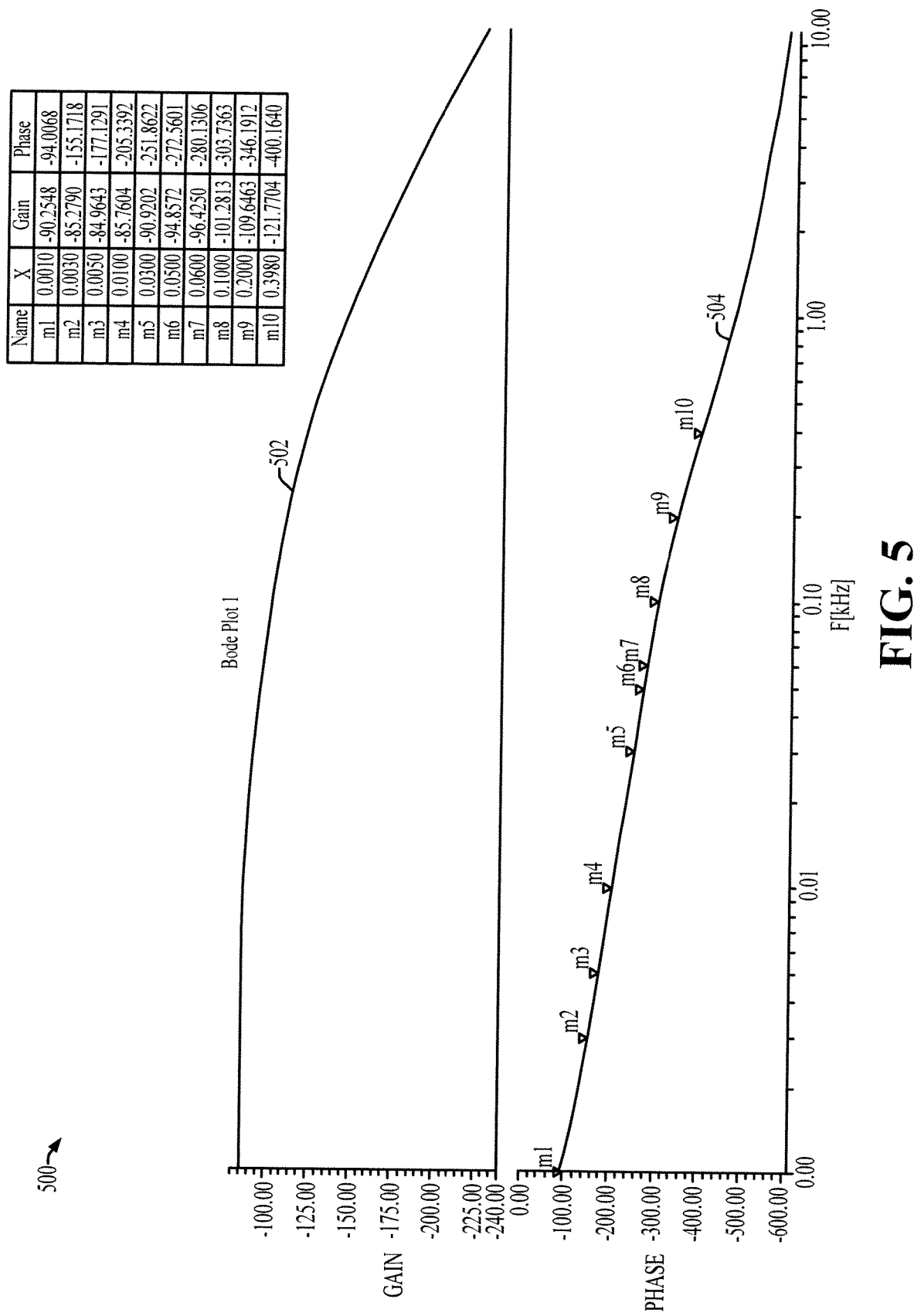
FIG. 5 is a graph showing simulated gain and phase as a function of frequency in the system of FIG. 1.
Figure 6:
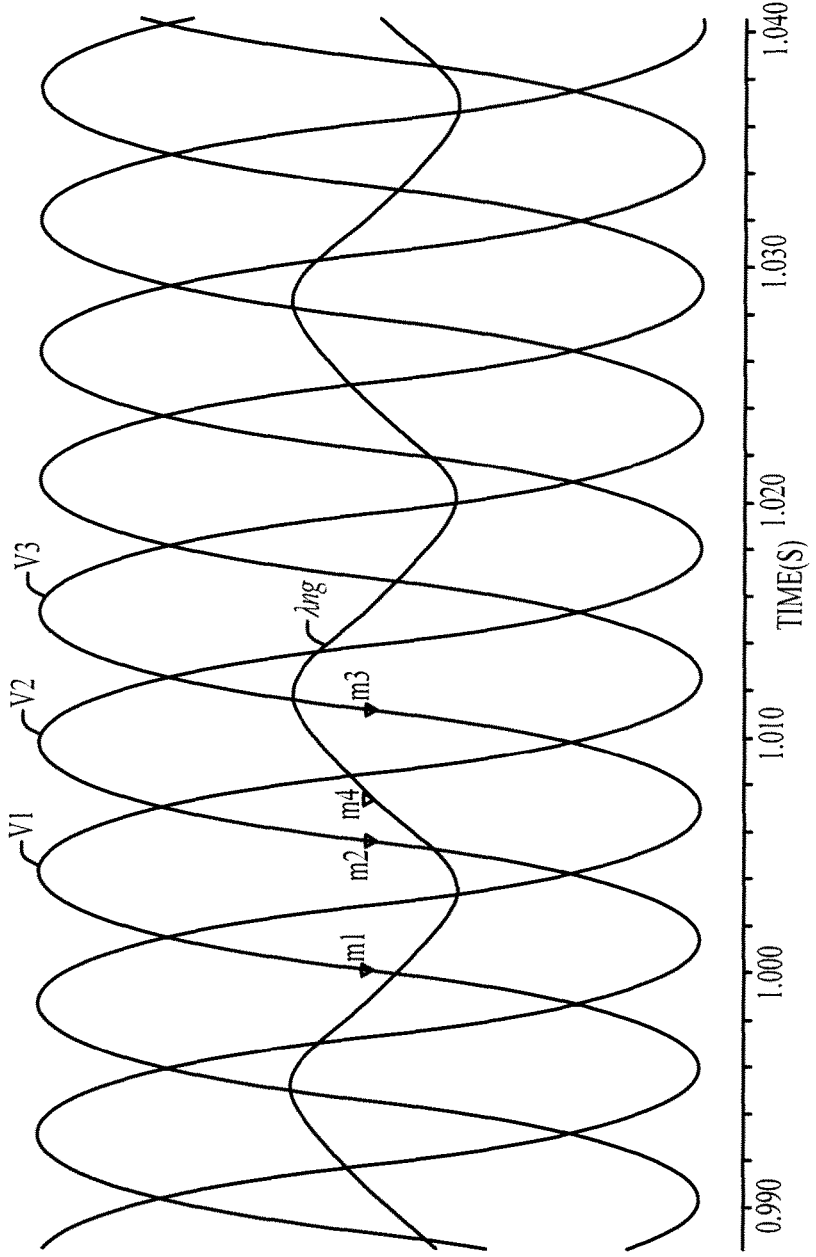
FIG. 6 is a graph showing simulated leakage flux linkage phase shift relative to inverter phase PWM reference voltages for operation at 60 Hz for identifying a faulted phase in the system of FIG. 1.
Figure 7:
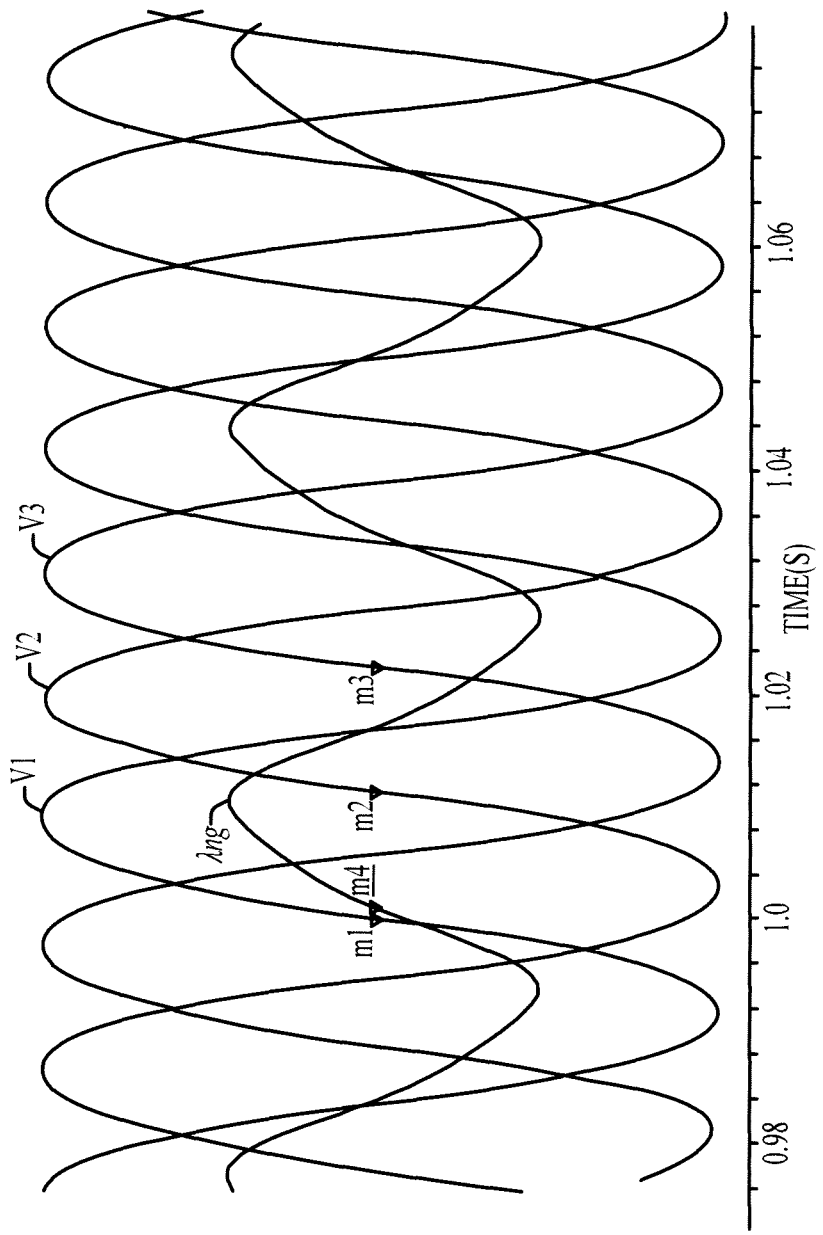
FIG. 7 is a graph showing simulated leakage flux linkage phase shift relative to inverter phase PWM reference voltage is for operation at 30 Hz for identifying a faulted phase in the system of FIG. 1.
Figure 8:
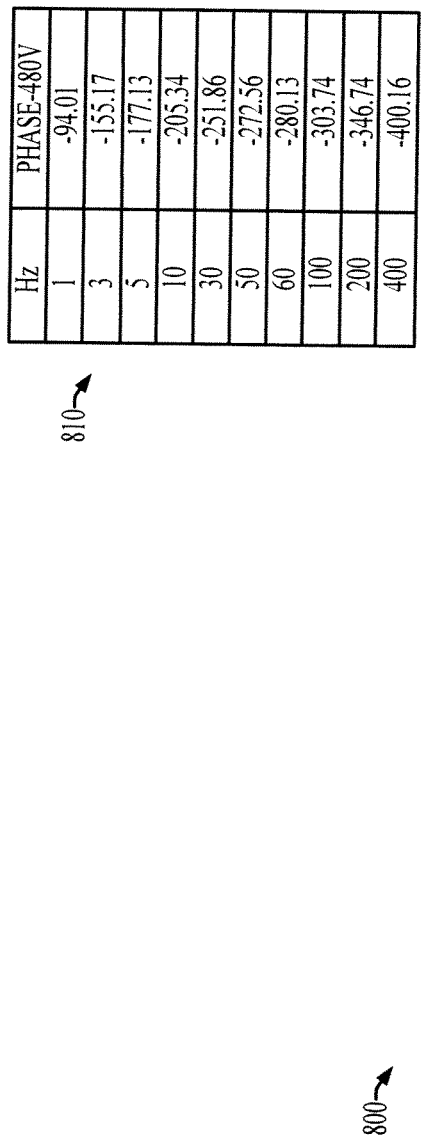
FIG. 8 illustrates value tables for identifying a faulted phase in the system of FIG. 1 according to the method of FIGS. 3A and 3B.

Referring also to FIGS. 4-8, FIG. 4 shows a simplified system diagram 400 illustrating the flow of fault current $I_{HRG}$ flow in a HRG fault condition where one of the leads of the motor load 111 is shorted via a fault resistance $R_{FAULT}$ to the ground node 104. As seen in the diagram 400, the AC source 102 operates as a source of common mode voltage $V_{CM\_source}$, and the inverter 114 operates as a source of common mode voltage $V_{CM\_inverter}$. A graph 500 in FIG. 5 illustrates simulated gain and phase curves 502 and 504 as a function of frequency in the system 100 of FIG. 1. Graphs 600 and 700 in FIGS. 6 and 7 illustrate simulated leakage flux linkage phase shift relative to inverter phase PWM reference voltages for identifying a faulted phase in the system of FIG. 1, showing voltage reference curve waveforms for three phase voltages V1, V2 and V3, as well as corresponding leakage flux linkage waveform $\lambda_{ng}$ for operation at 60 Hz and 30 Hz, respectively. FIG. 8 illustrates value tables 800 and 810 for identifying a faulted phase in the system of FIG. 1 according to an implementation of the method 300 of FIGS. 3A and 3B. The table 800 in FIG. 8 shows seven simulated tests of the system in FIG. 1 in which various phases were faulted. The table 810 illustrates a lookup table including various phase shift values $\varphi_{\lambda ng}(f_o)$ at different frequencies. The table 800 shows calculated lambda values representing the relative phase shifts computed at 324 in FIG. 3B, and the column representing the first test (Test 1) includes circle values indicating the operation at 60 Hz (phase shift value $\varphi_{\lambda ng}(f_o=60$ Hz$)=-280.13$ in the table 810), with the computed value $\varphi_{x-4}$ for phase 3 being the closest at $-280.08$. In one example, the phase shift threshold $TH_\varphi$ is 20°, although other values can be used (e.g., 10°, 5°, etc.). In the illustrated example 4 Test 1, the system 120 identifies the third phase (Ph3 in the table 800) as being faulted. The remaining columns for Test 2 through Test 7 show the matching phase shift value circled, where Test 1 and Test 2 simulate operation at 60 Hz, Test 3 shows results for simulated operation at 30 Hz (for which the phase shift value $\varphi_{\lambda ng}(f_o=30$ Hz$)=-251.86$ in the table 810), Test 4, Test 5 and Test 7 show results for simulated operation at 5 Hz (for which the phase shift value $\varphi_{\lambda ng}(f_o=5$ Hz$)=-177.13$ in the table 810), and Test 6 illustrates simulated results at 3 Hz (for which the phase shift value $\varphi_{\lambda ng}(f_o=3$ Hz$)=-155.17$ in the table 810).

As seen in the illustrated components 210-218 of FIG. 2, the ground fault detection system processor 122 in certain implementations executes code from the memory 124 in order to assess the leakage flux linkage values provided by the components 204, 206 and 208, where the leakage flux linkage waveform $\lambda_{ng}$ for a given operating frequency $f_o$ is characterized as a cosine function in terms of frequency and phase shift angle $\varphi_{\lambda ng}$ (designated as angle $\varphi_0$) in the illustrated components 210, 212 and 214 in FIG. 2. The processor 122 implements the component 214 in order to selectively identify the corresponding motor phase that is the cause of the detected fault, by comparing the phase shift angle $\varphi_0$ with the sum of a phase shift reference $\varphi_{refx}$ and the phase shift angle $\varphi_{shift}$ attributed to the sensor circuitry 115, the signal conditioning circuitry 116 and the components 202-208 of the ground fault detection system 120 (e.g., $\varphi_{shift}=\varphi_1+\varphi_2+\varphi_3$ in FIG. 2 above). Where these are equal, the corresponding phase (e.g., "x") is determined to be the source of the detected fault. This illustrates the processing at 320-334 in FIG. 3B above. The component 216 can be implemented in certain examples to determine whether an HRG ground fault is detected or not, and in one example the component 216 performs a comparison of the amplitude $A\lambda_{ng}$ of the leakage flux linkage signal waveform $\lambda_{ng}$ with a threshold to ascertain if the amplitude deviates significantly from zero (e.g., 302, 304 and 306 in FIG. 3A). In addition, the component 218 in FIG. 2 assesses the frequency $f_{\lambda ng}$ of the leakage flux linkage signal waveform $\lambda_{ng}$, and selectively identifies the host drive 100 as being the source of the detected fault if the inverter 114 of that drive is sufficiently close to the evaluated leakage flux linkage frequency $f_{\lambda ng}$.

As seen above, the disclosed examples automatically detect the presence or absence of a ground fault in a system that potentially includes multiple power converters or motor drives 100, automatically identify which drive is the source of the ground fault, and also automatically identify which phase of the fault to drive is the cause of the fault using the amplitude, frequency and phase shift of the leakage flux linkage signal waveform $\lambda_{ng}$. In alternate implementations, a given fault detection system 120 can be implemented which performs one some or all of these detection/identification functions in automated fashion without human intervention.

This automatic assessment is facilitated by the nature of the ground fault situation illustrated in FIG. 4, in which the neutral-ground voltage is given by the following equations (1)-(4):

$$V_{ng} = -(V_{CM\_Source} + V_{CM\_Inverter}) \cdot \frac{R_{HRG}}{R_{HRG} + R_{Fault}} \quad (1)$$

$$V_{ng} = -V_{ph} \quad (2)$$

$$V_{ph} = \frac{V_n}{f_n} \cdot f_o \cdot \sin(2\pi f_o t + \varphi_o) \quad (3)$$

$$V_{ng} = -\frac{V_n}{f_n} \cdot f_o \cdot \sin(2\pi f_o t + \varphi_o) \quad (4)$$

In this case, $V_{ph}$ is proportional to the output frequency to maintain the constant flux linkage for motor control. As a result, the output voltage of an adjustable speed drive (ASD) power conversion system 100 can be rewritten as the above equation (3), and the neutral to ground voltage is given by the equation (4). Based on motor constant flux linkage, integrating equation (4) provides the following equation (5), and the following equation (6) represents the leakage flux linkage signal waveform $\lambda_{ng}$.

$$\int_0^\infty V_{ng} dt = C_1 + \frac{V_n}{2\pi \cdot f_n} \cdot \cos(2\pi f_o t + \varphi_o) \quad (5)$$

$$\lambda_{ng} = \frac{V_n}{2\pi \cdot f_n} \cdot \cos(2\pi f_o t + \varphi_o) \quad (6)$$

$\lambda_{ng}$ is shown in equation (6), and can also be treated as the motor flux linkage from the ground fault location. Under the most widely used voltage-frequency (V/F) or flux vector mode operating condition, the ASD 100 will maintain constant flux linkage when the motor operates within the rated operating frequency range. Accordingly, the amplitude $A\lambda_{ng}$ will be generally constant even if the ASD output frequency changes. Moreover, as shown above, the leakage flux linkage signal waveform $\lambda_{ng}$ also includes frequency information related to the faulted phase, and the phase angle of $\lambda_{ng}$ contains the phase shift information of $V'''$ due to the hardware and software filtering and integration via the components 204, 206 and 208. The phase angle $\varphi_0$ of $\lambda_{ng}$ can also be used to confirm which drive is faulted when multiple drives have identical output frequency in certain embodiments.

Multi-drive systems are employed in a variety of automated industrial applications in which two or more motor drives are operated via a distributed power system, typically using power derived from a shared AC or DC power source. High resistance grounding (HRG) is often employed in such power distribution configurations to allow system components to continue operation during ground fault conditions, with high grounding impedances being used to limit the amount of ground fault current to allow continued safe system operation as well as to facilitate detection of ground faults. When a ground fault situation is detected, however, it may be difficult to identify the source of the fault condition, particularly where many motor drives are connected to a single power source. In a typical situation, service personnel must shut down or deactivate all the drives on a shared DC bus or shared AC connection, and repeatedly test individual drives in a lengthy process of elimination to determine which drive has a grounding problem. At each drive, a ground current measurement must be taken while the drive is running, which prevents usage of that drive and the other deactivated drives during the troubleshooting procedure, and also requires operation of the connected motor for ground fault testing, which may be disadvantageous in certain manufacturing situations. Manual techniques for locating the source of ground faults are thus time-consuming and costly in terms of system downtime as well as labor costs for service personnel.

Referring to FIGS. 9-13, several embodiments or implementations are hereinafter described in conjunction with the drawings, wherein like reference numerals are used to refer to like elements throughout, and wherein the various features are not necessarily drawn to scale. The present disclosure provides apparatus and methods for automatically identifying one or more suspected ground fault locations in multi-drive systems by which one or more shortcomings of manual techniques may be avoided or mitigated. Certain embodiments provide for self-diagnosis by motor drives 956 including integrated ground fault detection (GFD) circuitry 946 as well as implementing ground fault location (GFL) systems 948, with the drives 956 determining whether a high resistance ground (HRG) fault has occurred, and if so assessing whether the drive operating frequency (Fdrive) is at or near a fault frequency corresponding to the detected ground fault condition in the system 942. A drive 956 and/or another device of the system 942 (e.g., a programmable logic controller (PLC) 944, a standalone processor-based ground fault detection board or system 964, etc.) may be equipped with ground fault detection and/or ground fault location systems 946, 948, and may implement on-line system diagnosis by identifying a set or list of drives 956 suspected of being the location of a detected ground fault based on proximity of the drive operating frequency to the fault frequency, and may selectively confirm or exonerate individual drives 956 as being a fault location by individually adjusting operating frequencies of the drives 956 and detecting whether the fault frequency changes in response, while allowing the other drives in the system 942 to continue operation.

Figure 10:
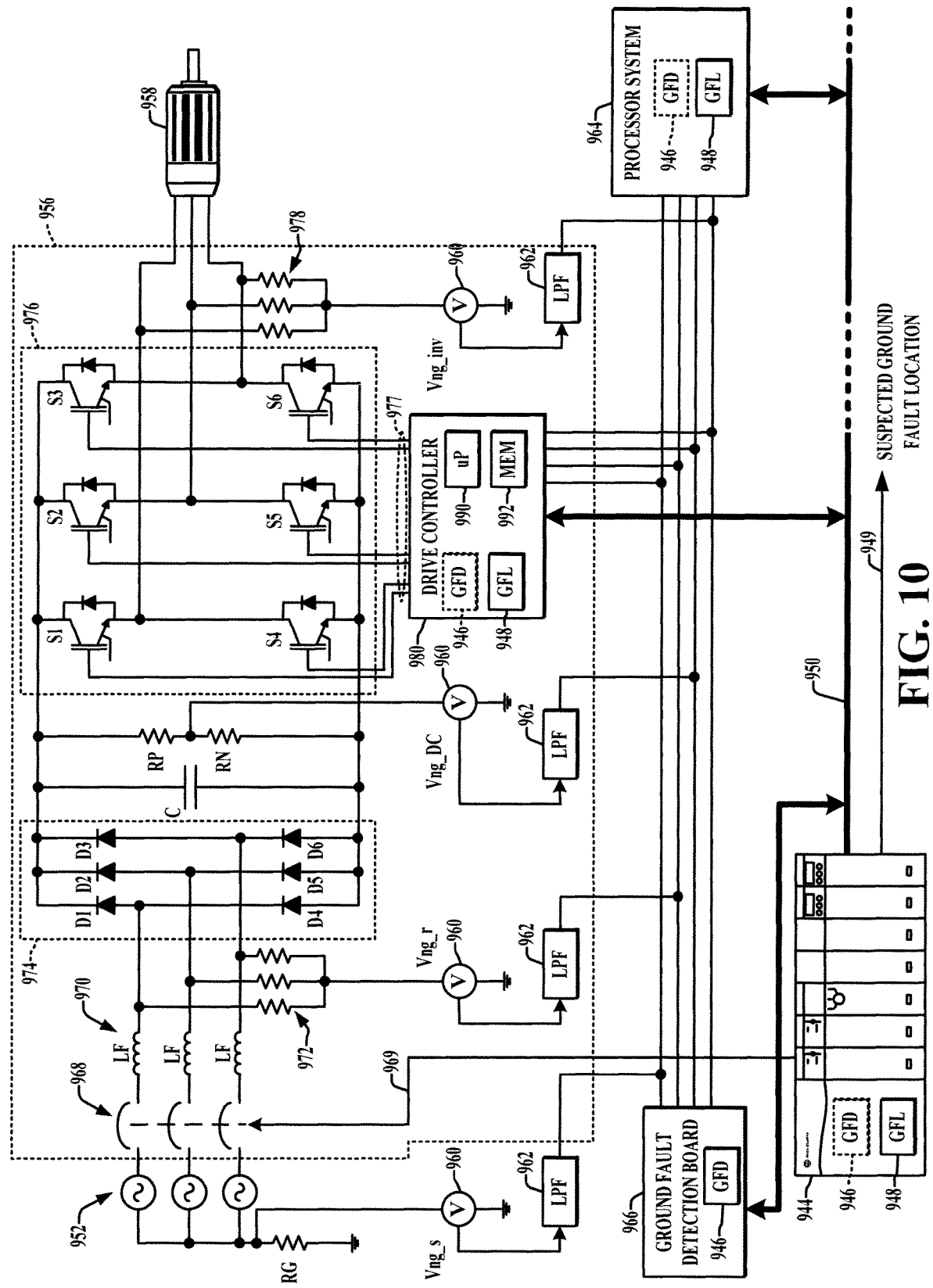
FIG. 10 is a schematic diagram illustrating an exemplary motor drive in the multi-drive system of FIG. 9 according to one embodiment.
Figure 13:
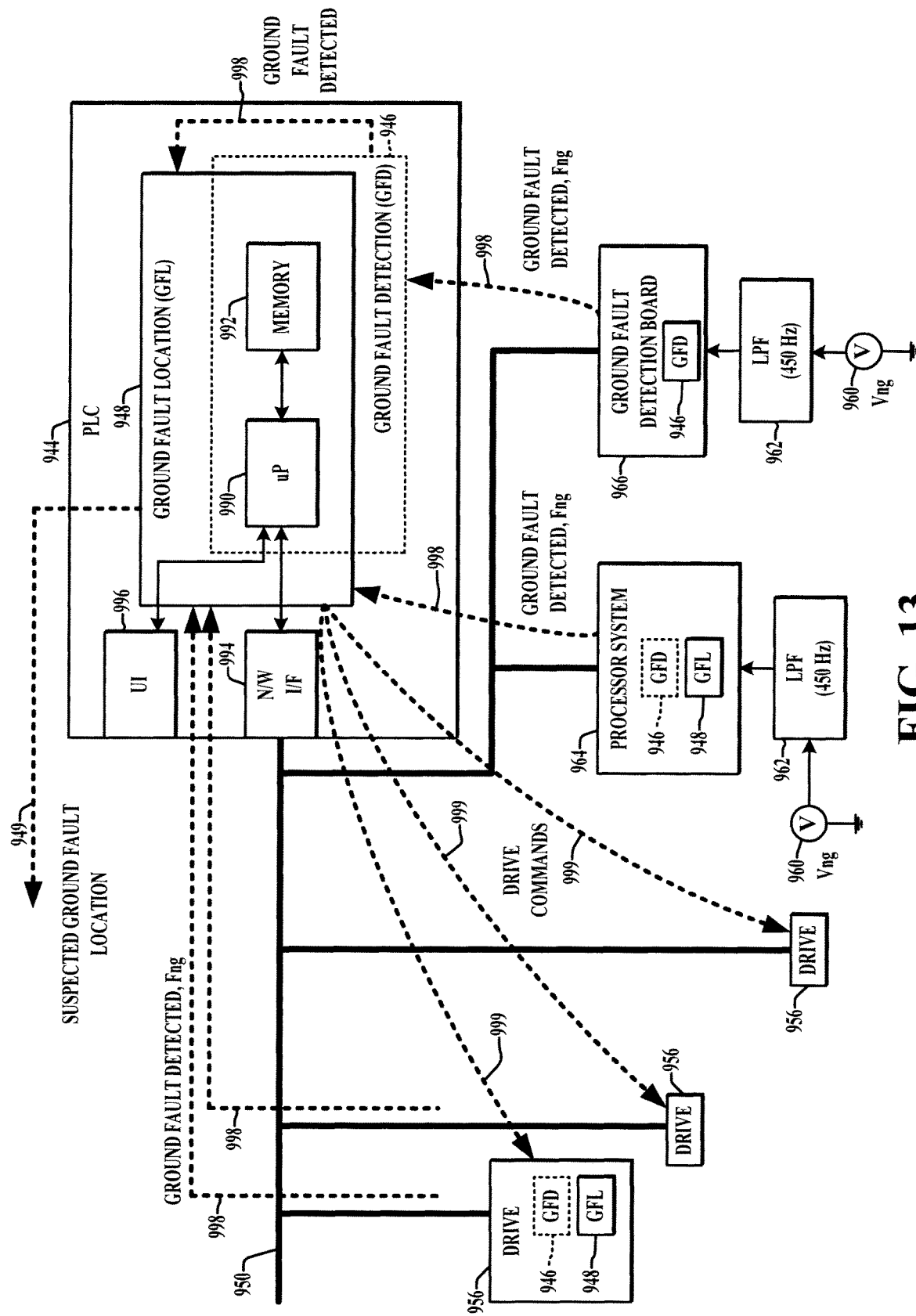
FIG. 13 is a schematic diagram illustrating an exemplary programmable controller implementing a ground fault location system in one embodiment.

Certain disclosed embodiments provide methods and apparatus for automatic ground fault location determination, which may be employed in a variety of distributed multi-drive environments. The various concepts of the present disclosure, moreover, can be implemented in a motor drive 956, in an industrial controller such as a PLC 944 or other processor-based control apparatus 964 to implement a ground fault location system 948 by way of any suitable hardware, processor-executed software, processor-executed firmware, programmable logic, analog circuitry, etc. which provides the described functionality as set forth herein, and may be operative using one or more processor elements executing computer executable instructions stored in an electronic memory of the system. FIG. 13 illustrates an exemplary microprocessor 990 of a PLC controller 944 having electronic memory 992 and a network interface 994 along with a user interface 996 that can be used in one possible implementation. Any suitable memory 992 can be used, such as a computer memory, a memory within a PLC 944 or power converter control system (e.g., drive controller 980 having a microprocessor 990 and a memory 992 as seen in FIG. 10), a CD-ROM, floppy disk, flash drive, database, server, computer, etc. which has computer executable instructions for performing the ground fault location functionality described herein.

The GFL system 948, moreover, may include one or more components, which may be implemented as software and/or firmware components in execution, programmable logic, etc., which is/are operatively, communicatively, coupled with a network 950 for interaction and messaging exchanges with motor drives 956, PLC 944, processor systems 964 and other network interface devices 966 that are also connected to the network 950. In this regard, any suitable networking technology 950 can be used for operatively interconnecting the system components 944, 956, 964, 966, etc., including without limitation Ethernet networks, wired and/or wireless networks, general purpose industrial networks such as ControlNet, industrial Ethernet networks such as Ethernet/IP, etc., fieldbus networks, such as PointIO (PointBus) used for communicating with I/O modules connected to a backplane bus, or the like or combinations thereof. In one non-limiting example, for instance, the GFL system 948 can be implemented in a ControlLogix® PLC controller 944 or other suitable controller and/or in a motor drive 956 such as those provided by Rockwell Automation, Inc.

Figure 16:
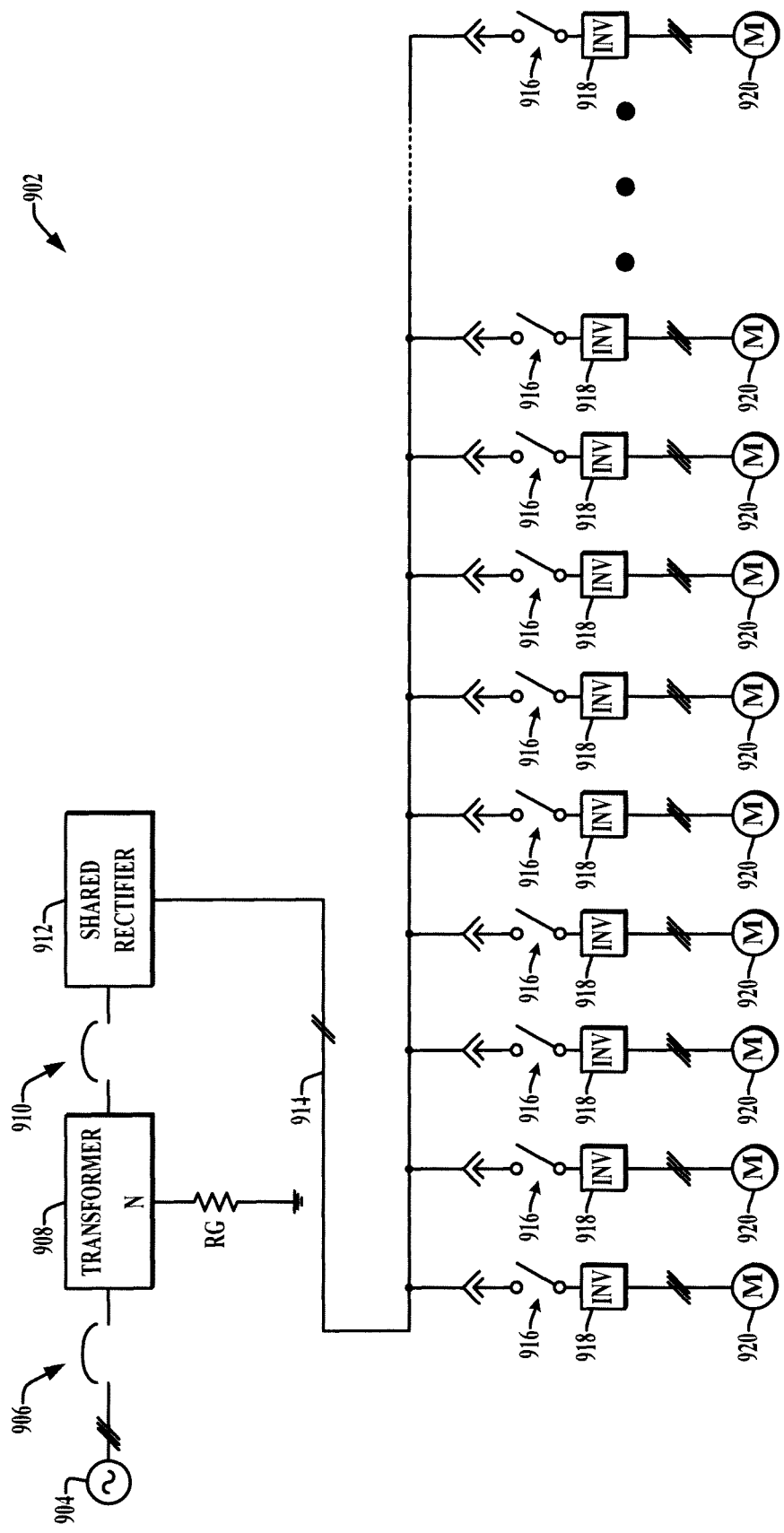
FIG. 16 is a system diagram illustrating an exemplary shared DC bus multi-drive system.
Figure 17:
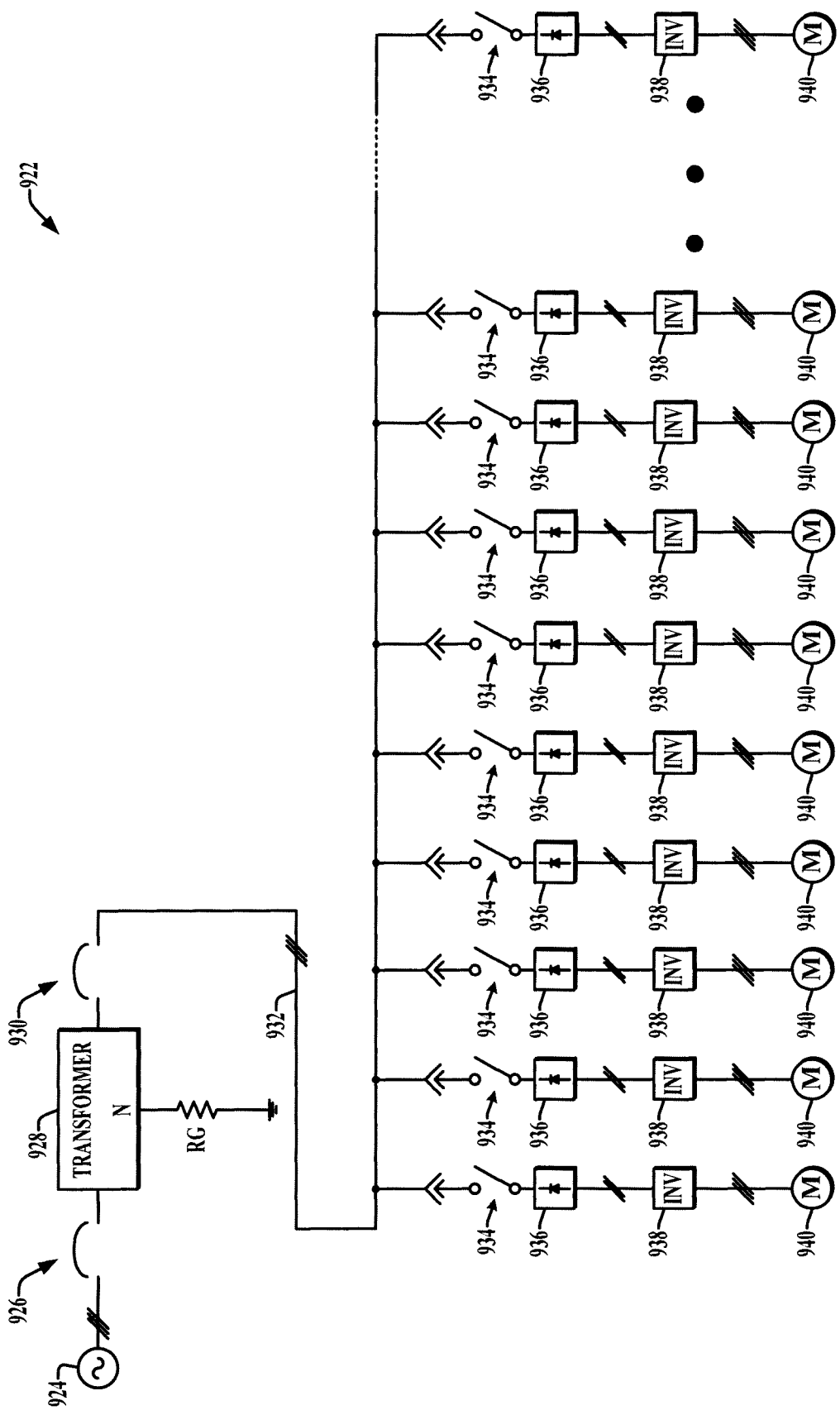
FIG. 17 is a system diagram illustrating an exemplary shared AC bus multi-drive system.
Figure 18:
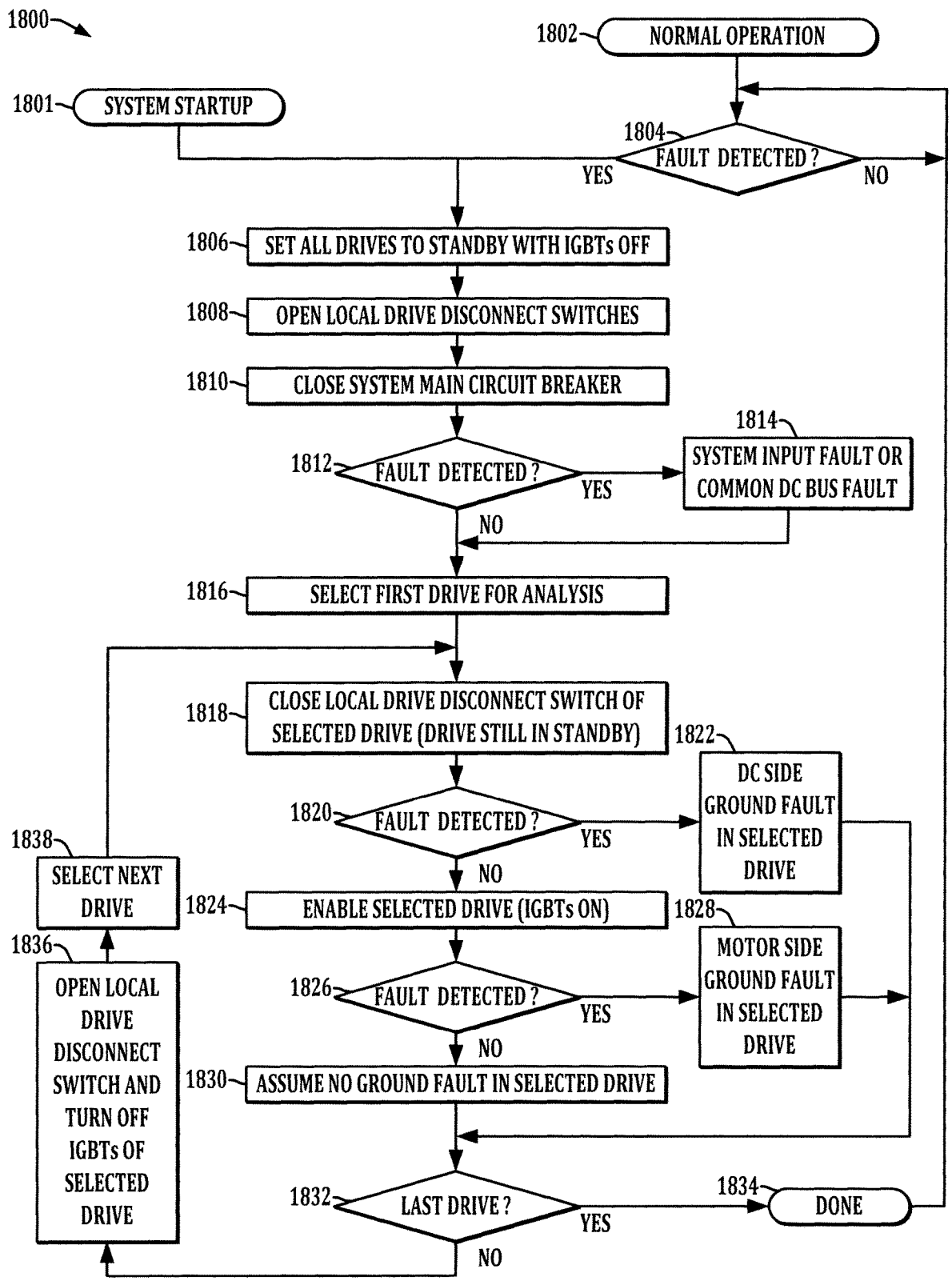
FIG. 18 is a flow diagram illustrating an exemplary method for identifying suspected ground fault locations in a multi-drive system in accordance with further aspects of the disclosure.

As also seen in FIGS. 16 and 17, the methods and controllers of the present disclosure can be used in connection with a variety of different multi-drive system configurations. FIG. 16 illustrates a shared DC bus multi-drive system 902 in which a three-phase AC input source 904 is connected to a transformer 908 by a three-phase switch or breaker 906, with a high resistance grounding resistor RG connecting the transformer secondary neutral "N" to ground using known high resistance grounding techniques, such as a resistor to limit ground fault current to about 1-10 A, thereby allowing the system to operate even if one or more ground fault conditions occur in the system 902. The secondary of the transformer 908 is connected through a three-phase breaker 910 to the input of a shared or common rectifier 912 which provides a common DC output bus 914 to drive a number of inverters 918. Each of the drives in this case includes an inverter 918 providing a three-phase variable frequency, variable amplitude AC output to drive a connected AC motor load 920, and each drive also includes a local power disconnect switch 916 to disconnect the inverter input from the shared DC bus 914. FIG. 17 shows a shared AC system 922 in which an AC input 924 provides three-phase AC power via a breaker 926 to a transformer 928 whose secondary neutral is grounded via a resistor RG, and whose output provides a shared three-phase AC bus 932 with a system breaker 930 optionally provided at the output of the transformer secondary. In this case, multiple drives are connected to the shared AC bus 932, and individually include a local drive disconnect switch 934 connected between the shared AC bus 932 and a local rectifier stage 936. The rectifier 936 provides a DC bus as an input to a local inverter 938, which in turn provides a three-phase output to drive a connected AC motor load 940 as shown. Ground faults may occur at various points within the systems 902, 922 in FIGS. 16 and 17. For instance, a ground fault can occur at the transformer 908 in FIG. 16 or at the secondary of the transformer 928 in FIG. 17. Alternatively or in combination, a ground fault could occur on the motor side of the drive inverters 918, 938 in either system 902, 922. Furthermore, ground fault conditions are possible at the DC-side of the motor drives, including along the shared DC bus 914 in FIG. 16, or at the local inverter inputs in FIG. 16. Also, DC side faults could occur in the rectifiers 936 of the drives in FIG. 17. As seen in FIGS. 16 and 17, therefore, manually diagnosing a detected ground fault condition in either system 902 or 922 is time-consuming and labor-intensive, particularly where large systems are involved.

Referring again to FIGS. 9-13, the present disclosure advantageously provides automated diagnostic techniques and systems 948 by which the location of one or more ground faults can be easily identified, while advantageously continuing operation of one or more drives at their desired operating points (e.g., speeds or frequencies), preferably within allowed system tolerance limits. Thus, whereas manual high resistance ground fault location identification techniques involve turning off all or many motor drives to individually assess each drive while the other drives are off, the various concepts of the present disclosure advantageously facilitate automated ground fault location functionality without system shutdown. In particular embodiments, for instance, individual motor drives 956 can perform self-diagnosis based on frequency analysis of one or more fault signals, such as a neutral-ground voltage, a high resistance ground current signal, etc. by determining whether the host drive 956 is operating at or near a frequency associated with the detected fault signal (e.g., a neutral-ground voltage signal Vng or an integral INTVng of the neutral-ground voltage Vng having a frequency Fng).

In addition, disclosed ground fault location system embodiments 948 assess operating speed or frequency information from the drives 956 of the system 942 in order to identify a set or list of suspect drives 956 operating at or near the fault frequency Fng, and individually adjust one or more of the operating frequencies Fdrive of the suspected drives 956 one other time while the system 942 continues normal operation, and while the fault frequency Fng is monitored. The GFL system 948 determines whether the fault frequency changes by a threshold amount in response to adjustments or changes to the operating frequency Fdrive of a single selected suspect drive 956, and if so, identifies that drives 956 as the location or source of the detected ground fault condition. Otherwise, that selected drive 956 is exonerated, and the system 948 performs similar operation with respect to other drives 956 in the suspect set. In certain embodiments, moreover, the system 948 may also identify system ground fault locations, such as a shared AC bus and/or a shared DC bus were the fault frequency Fng is at or near a system operating frequency (e.g., the line frequency of an AC source powering the system 942) if all the suspected drives 956 are exonerated by speed adjustment analysis. In this manner, the ground fault location system 948 advantageously facilitates automated identification of the location of a detected high resistance ground fault condition in the system 942 without disrupting system operation, thereby limiting the system downtime and manual effort, particularly compared with manual ground fault location approaches.

Figure 9:
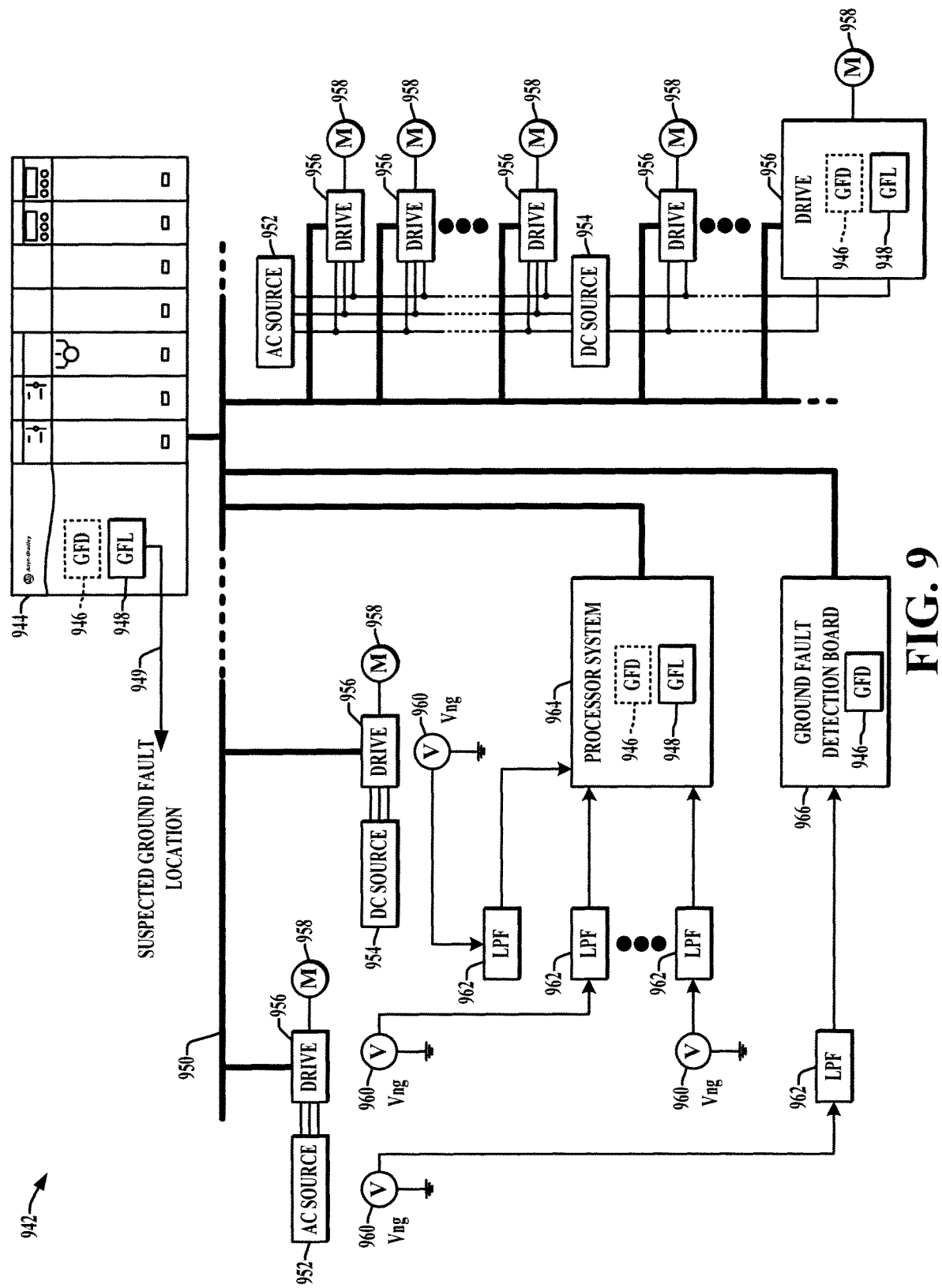
FIG. 9 is a system diagram illustrating a networked multi-drive system with a programmable logic controller connected to a plurality of motor drives via a network for driving multiple motor loads with local and centralized ground fault location systems for identifying ground fault locations in the system according to one embodiment.

FIG. 9 is a schematic diagram illustrating an exemplary multi-drive system 942 including a programmable logic controller or PLC 944 connected to an Ethernet or ControlNet network 950, as well as a plurality of motor drives 956 driving associated AC motor loads 958, where the individual drives 956 in this non-limiting example are each connected to an associated AC source 952 or DC source 954. As shown, moreover, several drives 956 may be powered from a shared AC or DC source 952, 954, and different drives 956 may be powered by separate sources 952, 954 in a variety of different technologies or configurations, wherein the various concepts of the present disclosure are not limited to any particular power distribution architecture. As seen in FIG. 9, moreover, the PLC 944 in this embodiment includes a ground fault detection system 946 operative to detect the presence or absence of a high resistance ground fault condition within the system 942, as well as a ground fault location system 948 implemented using a processor 990 (FIG. 13) of the PLC 944 for automated ground fault location identification as described further herein. Moreover, one or more of the drives 956 may likewise be configured with a ground fault detection system 946 and/or a ground fault location system 948. Furthermore, as seen in FIG. 9, a dedicated ground fault detection board 966 may be provided in the system 942 for monitoring one or more signals (e.g., a neutral-ground voltage Vng associated with the AC source 952 in the example of FIG. 9) for determining or detecting the presence or absence of a high resistance ground fault condition in the system 942. Also, a dedicated processor system 964 may be provided in the system 942, including a ground fault detection system 946 and/or a ground fault location system 948, wherein the illustrated example provides network connections between the PLC 44, the drives 956, the processor system 964 and the ground fault detection board 966 via the network 950.

As seen in FIG. 9, moreover, various sensors 960 may be disposed at different points within the system 942 to measure one or more neutral-ground voltages indicated in the figures as Vng, and the sensor outputs may be optionally filtered using hardware low pass filters (LPF) 962 suitable for use in detecting the presence of a ground fault. For example, low pass filters 962 in certain embodiments may be configured with cutoff frequencies above normal operating frequencies of the motor drives 956 and above expected line frequencies in the system 942. In other possible embodiments, the low pass filter components or circuits 962 may be omitted, and/or the receiving system 946 may perform one or more filtering operations in hardware, processor-executed firmware, processor-executed software, programmable logic, etc. In the illustrated example, the outputs of the low pass filters 962 can be provided to a processor system 964 that implements a ground fault detection (GFD) system 946, such as through suitable analog to digital (A/D) conversion circuitry and processor-executed programming to generate one or more signals or values or messages for provision to the ground fault location system 948 in the PLC 944, in the drive(s) 956 and/or in the processor system 964, for example, through the network 950 indicating that a ground fault has been detected by one of the sensors 960.

Figure 11:
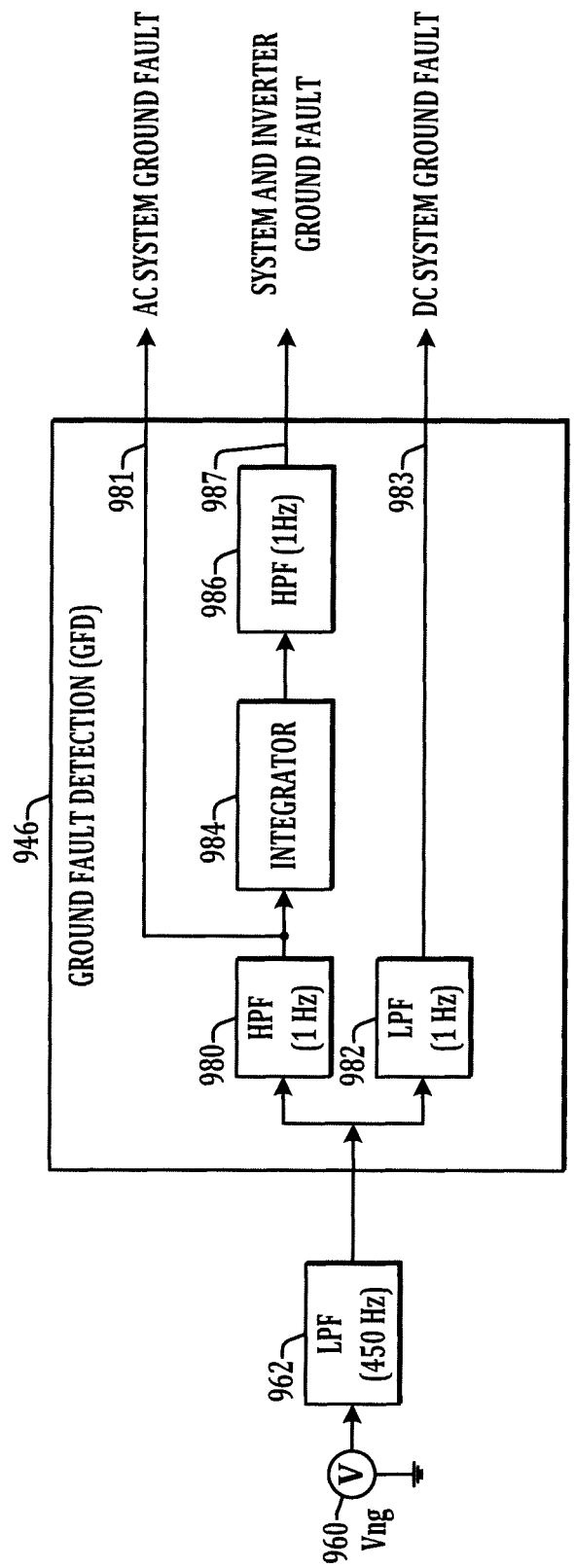
FIG. 11 is a schematic diagram illustrating an exemplary ground fault detection system providing a plurality of ground fault detection signals in accordance with one or more aspects of the present disclosure.

As best shown in FIG. 11, one possible implementation of a ground fault detection (GFD) system 946 is illustrated, which may be implemented in the PLC 944, in a separate processor system 964, and/or in the drive controller 980 or other processor-based system in the motor drive 956. There may be other similar ground fault location identification methods that can be used as well, wherein the illustrated example is but one possible implementation. As seen in FIG. 11, the exemplary ground fault detection system 946 includes high pass and low pass filter components 980 and 982, respectively, in one case implementing corresponding cut in and cut off frequencies, with the external low pass filters 962 having a higher cutoff frequency. One suitable on-board example for the ground fault detection system 946 is illustrated and described in co-pending US patent application publication number 2003/0218491 A1 to Wei et al., published Aug. 22, 2013, and assigned to the assignee of the present disclosure, the entirety of which is hereby incorporated by reference as if fully set forth herein. In the illustrated non-limiting example, moreover, the GFD system 946 provides an AC system ground fault indication 981, as well as a system and inverter ground fault indication 987 and/or a DC system ground fault indication 983, where the output indications 981, 983 and 987 can be any suitable form of analog signal, digital message, etc. In addition to the filters 980 and 982, the GFD system 946 includes an integrator component 984 and another high pass filter 986 having a cut in frequency of about 1 Hz connected in series with the integrator 984 to provide the system and inverter ground fault indication 987. The components 980, 982, 984 and 986 of the ground fault detection system 946 may be implemented using any suitable hardware, processor-executed software, processor-executed firmware, programmable logic, analog circuitry, etc. which provides the described ground fault detection functionality as set forth herein, and may be operative using one or more processor elements executing computer executable instructions stored in an electronic memory.

Figure 12:
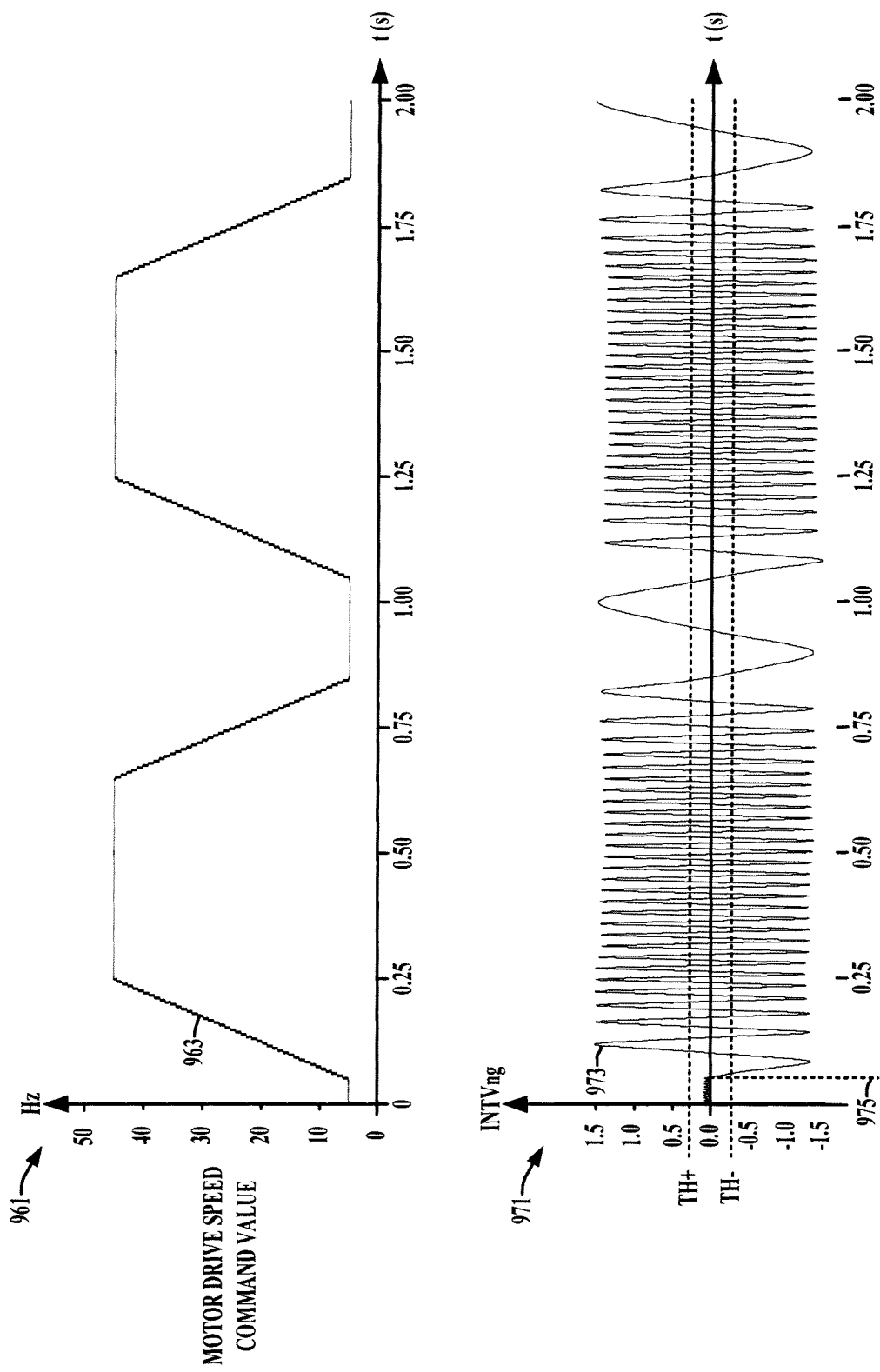
FIG. 12 is a waveform diagram illustrating exemplary ground faulted drive operating frequency and neutral-ground fault integral signal curves in one embodiment.

FIG. 12 illustrates a waveform diagram showing a graph 980 illustrating a motor drive speed command value 982 as a function of time, as well as a graph 984 illustrating an exemplary curve 986 showing an integral INTNvg of a neutral-ground voltage Vng measured by one of the sensors 960 in the system 942. In one possible implementation, a ground fault detection system 946 generates an integral signal INTVng or otherwise computes the integral and compares the amplitude of such a neutral-ground voltage integral signal 986 with a positive and negative threshold range TH+, TH−. The system 946 detects or identifies a high resistance ground fault condition in the system 942 if the measured neutral-ground voltage integral signal 986 is outside the range defined by these thresholds (e.g., no fault detection where TH−≤INTVng≤TH+), and otherwise a fault is detected if the neutral-ground voltage integral signal amplitude is greater than or equal to a threshold value. Moreover, one or more of the motor drives 956 may internally provide one or more sensors 960 for measuring neutral-ground voltages or other operating parameters and generating suitable ground fault detection signals or messages for provision to the controller 944 or other ground fault location system 948 via the network 950 indicating detection of ground faults at or proximate the corresponding motor drive 956 as well as a determined fault frequency.

In addition, the ground fault detection systems 946 in certain embodiments also analyze the corresponding neutral-ground signal Vng (and/or its integral INTVng) with respect to frequency content, for example, using zero crossing detection circuitry, phase locked loops, or other suitable frequency determination means, and provide the ground fault location system 948 with a fault frequency Fng by way of a signal or value corresponding to a detected ground fault condition in the system 942. Moreover, as seen in FIG. 9, the PLC 944 may also implement a ground fault detection system 946, for internally generating flags, or values, or other status indicators indicating that a fault has been detected based on received messaging indicating a value of one of the neutral-ground voltages Vng (and/or its integral INTVng) from the sensors 960 that indicates a ground fault has occurred. For instance, the ground fault detection board 966 may include A/D converter and network interface components and may be configured to receive the output of one or more of the low pass filter 960 and provide one or more network messages to the controller 944 (or to any other ground fault location system 948) through the network 950 indicating the value of the received signal, by which the ground fault detection system 946 of the PLC controller 944 may ascertain whether the received value (and/or its integral INTVng) is indicative of the presence of a ground fault condition in the system 942.

FIG. 10 is a schematic diagram illustrating further details of an exemplary motor drive 956 embodiment in the system 942, which receives AC input power through a local drive disconnect switch 968 from an AC source 952. The drive 956 in this example includes input filter inductors LF 970, and a passive rectifier 974 including diodes D1-D6 providing a DC bus voltage across a bus capacitor C. The DC bus voltage is provided as an input to an inverter stage 976 including active switching devices S1-S6 operated according to switching control signals 977 from a drive controller 980. In addition, the PLC 944 in this example provides a control signal 969 to operate the local drive disconnect switch 968 or this could be operated manually, with the PLC 944 optionally automatically prompting such manual operation. The drive controller 980 can be any suitable hardware, processor-executed software, processor-executed firmware, programmable logic, analog circuitry, etc. which provides the described functionality as set forth herein, and may be operative using one or more processor elements 990 executing computer executable instructions stored in an electronic memory 992 of the drive 956, for implementing ground fault detection system 946 and optionally a ground fault location system 948 as described herein. In other embodiments, an active front end rectifier 974 may be used, for example, to implement active front end control for power factor correction and/or for regenerative drive operation according to suitable rectifier switching control signals (not shown) from the drive controller 980. Moreover, alternate embodiments are possible using a current source rectifier 974 and a current source inverter 976, and which include one or more DC link chokes with the capacitor C being omitted. The inverter stage 976 provides an AC output having controlled frequency and amplitude in order to drive a motor or other load 958 according to the switching control signals 977.

The ground fault location system 948, whether implemented in the drive controller 980, the PLC 944, or in another network device (e.g., processor system 964 in FIG. 9) is operatively connected to the network 950 in order to exchange control commands, data and other information with the PLC 944, drives 956 and other devices on the network 950. As seen in FIG. 10, the drive controller 980 is operative to receive commands from the PLC 944 and to alter the operation of the drive 956 accordingly, including provision of the inverter switching control signals 977 and/or control of the operational state of the local drive disconnect switch 968 via the control signal 969. In this regard, the drive controllers 980 in the illustrated drives 956 of the system 942 in FIG. 9 are operative to receive local drive speed commands or operating frequency commands and to control operation of the corresponding inverter 976 in order to drive the motor load 958 at a corresponding frequency (Fdrive), and the drives 956 also report their operating frequencies Fdrive to the PLC 944 either in a regular unsolicited fashion, or in response to request messages from the PLC 944. In this manner, the PLC 944 or a drive 956 or another processor system 964 can implement a ground fault location system 948 which sends various network messages to particular drive controllers 980 (directly or indirectly) to selectively adjust individual motor drives 956 by requesting individual drives 956 to operate at a designated drive frequency Fdrive thereby facilitating intelligent ground fault location operations as described herein to identify suspected ground fault locations within a multi-drive system 942. Non-limiting examples include the capability of the PLC 944 to send one or more network messages to cause local drive controllers 980 to operate the inverter switches S1-S6 to rotate the motor load 958 according to a given frequency command (speed command). The illustrated drive controller 980 is further programmed to implement various motor control functions associated with operation of the motor drive 956 as are known. In certain implementations, moreover, where a ground fault location system 948 is implemented in a local drive 956 or in a stand-alone processor system 964, the operating GFL system 948 may provide individual drive frequency commands directly to a selected drive 956 via the network 950, or may provide such to the PLC 944, which in turn, provides the drive frequency commands to the selected drives 956 via the network 950.

As seen in FIG. 10, sensor apparatus 960 may be provided at various locations to measure neutral-ground or other voltages or operating parameters associated with operations of the drives 956 as well as other locations within a multi-drive system 942. In particular embodiments, neutral-ground signals are measured via the sensors 960, such as a neutral-ground voltage Vng as illustrated. Other implementations are possible using different neutral-ground measured signals, including without limitation neutral-ground current signals, etc. In addition, one or more such signals may be measured and used and integrated for detecting the presence and frequency of a high resistance ground fault within the system 942. As illustrated in FIG. 10, for example, a sensor 960 is operatively connected to measure a neutral-ground voltage Vng_s associated with the AC source 952, such as the voltage across a grounding resistor RG in one example, and provides a sensor signal as an input to an optional low pass filter 962. The filter output provides an input to a standalone ground fault detection board 966 including an A/D, a processor and a network interface, which in turn implements a ground fault detection system 946 that provides a value to the PLC 944 through the network 950 indicating whether an integral of the measured intra-ground voltage signal exceeds a threshold, e.g., as shown in the graph 984 of FIG. 12. In this case, there is initially no-fault until the time 975, after which the neutral-ground voltage integral signal 973 INTVng exceeds one or both of the thresholds TH+, TH−.

The ground fault detection systems 946 in certain embodiments perform integration and the threshold comparison to determine the presence of a ground fault condition in the system 942 by any suitable means, including without limitation hardware comparator circuitry, A/D conversion with software-implemented threshold comparison functions, etc. In addition, the ground fault detection systems 946 also implement frequency detection functionality, for example, using zero-crossing circuitry or processor-implemented functions, phase locked loops, etc., and also provide a fault frequency signal or value (Fng) indicating the frequency of the neutral-ground voltage signal Vng (or of its integral INTVng) to one or more ground fault location systems 948 via the network 950. In this manner, the ground fault location system(s) 948 are provided with indications of whether or not a ground fault condition exists in the system 942, as well as a fault frequency (Fng) corresponding to a detected ground fault condition in the system 942.

As further seen in the example of FIG. 10, line-neutral sense resistors 972 are connected from the rectifier input terminals between the filter inductors 970 and the rectifier 974 with the rectifier neutral voltage Vng_r being measured by another sensor 960 that provides a signal to the A/D and network interface component 966 through another low pass filter 962. In this example, moreover, positive and negative DC bus sense resistors RP and RN are connected in series with one another across the DC bus in parallel with the capacitor C, and are of substantially equal impedance values to provide a DC mid-point voltage (e.g., neutral-ground voltage) Vng_DC sensed by a corresponding sensor 960 and associated low pass filter 962. The example of FIG. 10 also includes output neutral voltage sense resistor 978 connected as shown to allow measurement by a sensor 960 of an inverter neutral-ground voltage Vng_inv. Also or separately, sensors 960 and/or the low pass filters 962 shown in FIG. 10 may be integrated into a motor drive 956 or may be separate components.

Where provided, moreover, a separate ground fault detection board 966 may receive analog signals directly from the sensor 960 and/or from any provided intervening low pass filters 962, and may provide corresponding digital values indicating detection of a ground fault and corresponding fault frequency Fng to the PLC 944 accordingly. In the illustrated example, the PLC 944 may also implement a ground fault detection system 946 which determines whether a ground fault condition is suspected based on one of the received values according to any suitable ground fault identification or ground fault detection technique or algorithm, and the PLC-implemented ground fault detection system 946 may also receive a series of measured fault signal values (Vng) and determine a corresponding fault frequency in certain embodiments. As further shown FIG. 10, moreover, the processor system 964 may receive the analog measured signals directly from the sensors 960 and/or from associated low pass filters 962, and may implement an on-board ground fault detection system 946, with the processor system 964 providing ground fault detection indications and a corresponding fault frequency to a ground fault location system 948 in the PLC 944, in a drive 956, or elsewhere in the system 942, via the network 950. Furthermore, a ground fault detection system 946 may also be implemented by the drive controller 980, with the controller 980 receiving signals from the sensors 960 and/or from any associated low pass filters 962 and providing network messaging including indications of detected ground fault conditions through the network 950 to the PLC 944.

FIG. 12 illustrates motor drive frequency (speed command value) and neutral-ground voltage integral waveform diagrams 961 and 971, respectively, in one embodiment. The inventors have appreciated that high resistance ground fault conditions in a multi-drive system 942 may be indicated by a signal waveform amplitude, and the source of such a detected fault can be automatically identified based at least partially on an AC frequency associated with such a signal. In the illustrated implementations, a neutral-ground signal waveform (e.g., voltage Vng, neutral-ground current signal, etc.) is used and integrated, but other electrical signals may be monitored and assessed in order to determine the presence of a ground-fault condition, and such signals may be used which have an associated frequency at least partially indicative of a fault source. In the present disclosure, this relationship is used by the ground fault location system 948 for selectively identifying individual drives 956 as suspected sources of detected ground faults in the system 942. As seen in the graph 971 of FIG. 12, for instance, the neutral-ground voltage integral signal 973 initially has a very low signal amplitude, and a ground-fault condition occurs in a particular associated motor drive 956 at time 975, whereupon the amplitude of the waveform 973 increases significantly (e.g., beyond a threshold range defined by the illustrated thresholds TH+, TH−. During the subsequent fault condition time period, moreover, oscillations in the integral signal 973 occur at a frequency generally dependent upon the operating speed (frequency Fdrive) of the associated motor drive 956.

In this regard, FIG. 12 illustrates a graph 961 showing a commanded motor drive speed 963 increasing from approximately 5 Hz up to approximately 45 Hz at 0.25 seconds, and then decreasing back to around 5 Hz at 0.80 seconds, and undergoing a subsequent ramp up and ramp down cycle as shown. The frequency of the neutral-ground voltage integral signal waveform 973 likewise increases and decreases generally proportional to the motor drive speed command value 963. The illustrated ground fault location systems 948 advantageously utilize this relationship in selectively identifying a suspected ground fault location in the multi-drive system 942.

Operation of the ground fault location system 948 is illustrated and described hereinafter in connection with FIGS. 9-15, using the example of a PLC-implemented ground fault location system 948 receiving input information from one or more ground fault detection systems 946 in the system 942. Similar operation may be implemented in a motor drive-based around fault location system 948 and/or in a separately implemented ground fault location system 948 (e.g., in the processor system 964 separate from any PLC or motor drive).

Figure 14:
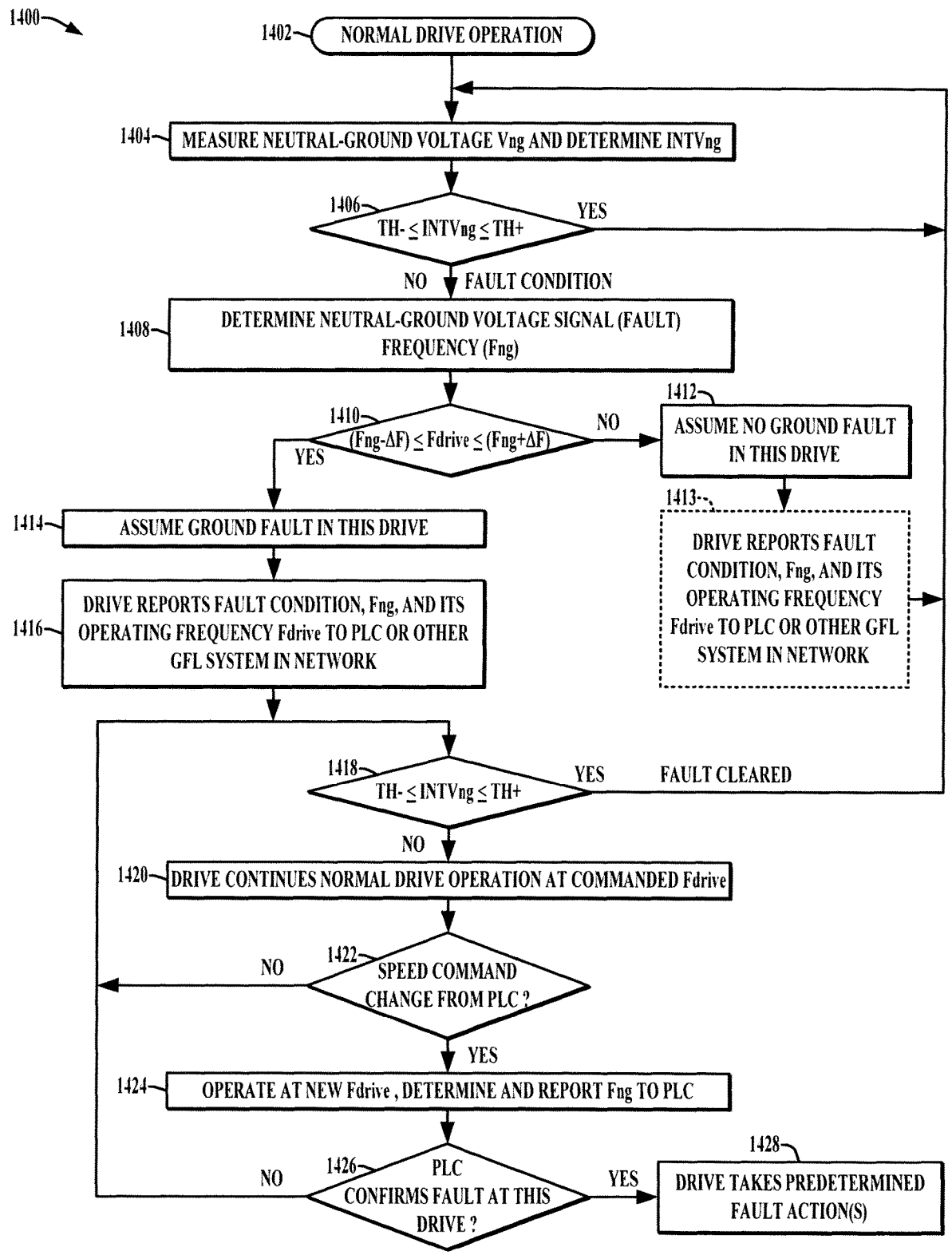
FIG. 14 is a flow diagram illustrating an exemplary method for ground fault location self-diagnosis in a motor drive in one embodiment.
Figure 15:
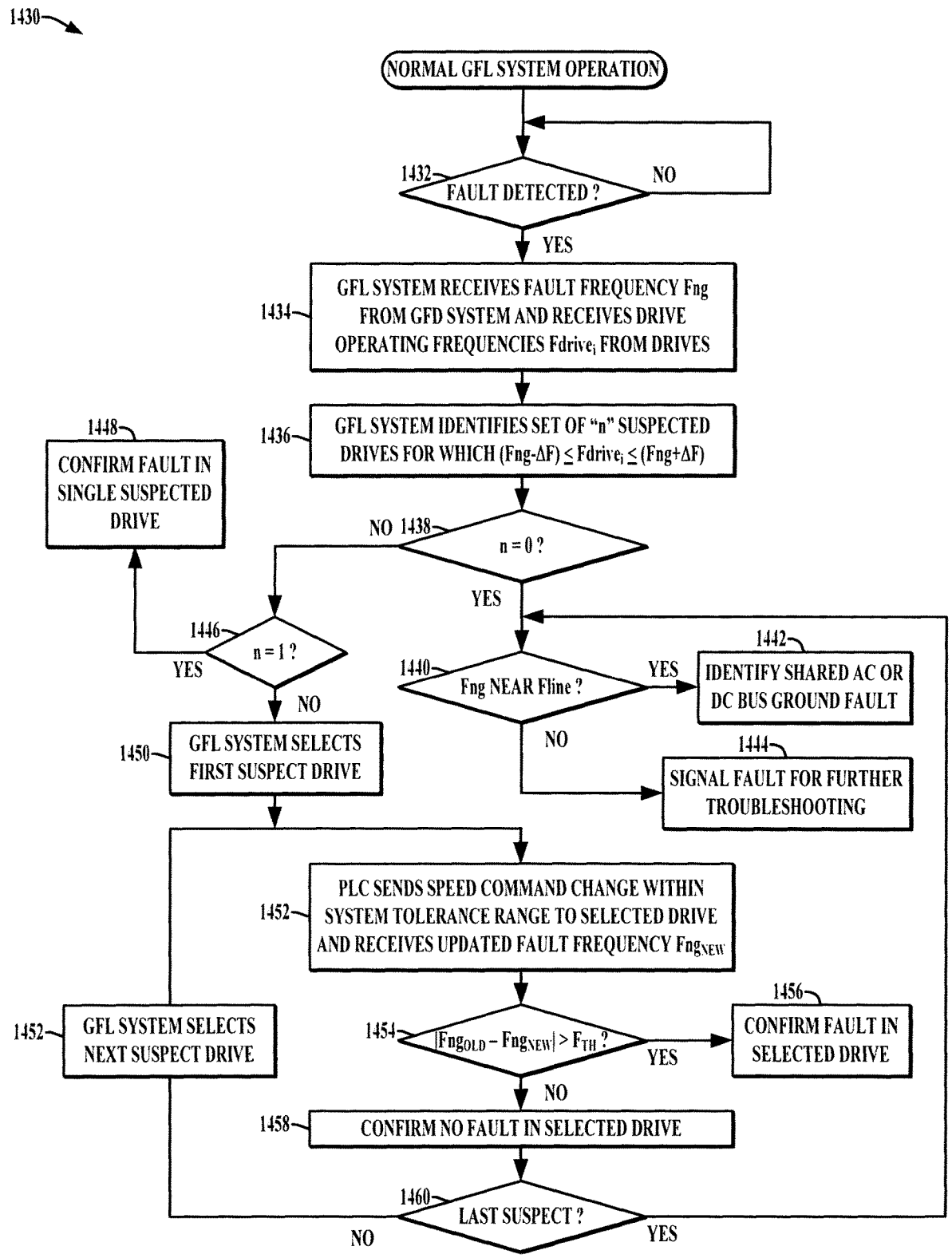
FIG. 15 is a flow diagram illustrating an exemplary method for ground fault location through suspect identification and selective frequency adjustment for drive exoneration or fault location confirmation in one embodiment.

FIG. 14 is a flow diagram illustrating an exemplary process 1400 for operation of a motor drive 956, in which a ground fault detection system 946 and ground fault location system 948 of the drive 956 perform ground fault location self-diagnosis. In addition, a flow diagram in FIG. 15 depicts an exemplary method 1430 for ground fault location through suspect identification and selective frequency adjustment for drive exoneration or fault location confirmation in one PLC-implemented GFL system embodiment 948. As seen in FIGS. 10 and 13, the ground fault location system 948 provides an output 949, such as a network message or other signal or value, indicating one or more suspected ground fault locations in the system 942 according to received ground fault detection and fault frequency indications 998 from the various ground fault detection systems 946. In this regard, the ground fault detection and frequency indications 998 may be any suitable form of analog signal, digital message, etc. in various embodiments. In one possible example, the indications 998 are one or more messages sent through the network 950 indicating (1) that a ground fault condition exists, and (2) a corresponding ground fault signal frequency (e.g., Fng).

The PLC 944 in one embodiment includes a processor 990 and associated electronic memory 992, with the processor 990 being operatively coupled with the memory 992 as well as a network interface component 994 and a user interface component 996. The PLC 944 may be any suitable type of industrial control apparatus, such as a rack-mounted system including one or more modules connected to a common backplane bus for connection of I/O and networks, including an industrial network 950, for example, ControlNet. As seen in FIG. 13, the ground fault location system 948 is configured by suitable programming instructions in the PLC 944 (e.g., stored as program instructions in the memory 992 in one example), by which the GFL system 948 sends drive commands 999 in certain cases including adjusted drive speed or frequency commands to one or more of the networked motor drives 956, and receives ground fault detection and fault frequency indications 998 from one or more of the drive 956 and/or from a separate processor system 964 implementing a ground fault detection system 946, from a separate ground fault detection board 966, and/or from a ground fault detection system 946 implemented in the PLC 944 to internally provide detection indications 998 based on received ground-neutral voltage messages (e.g., from the A/D and network interface component 966 as described above).

The processes 1400 and 1430 of FIGS. 14 and 15 are illustrated and described below in the form of a series of acts or events, although the various methods of the disclosure are not limited by the illustrated ordering of such acts or events. In this regard, except as specifically provided hereinafter, some acts or events may occur in different order and/or concurrently with other acts or events apart from those illustrated and described herein in accordance with the disclosure. In addition, not all illustrated steps may be required to implement a process or method in accordance with the present disclosure, and one or more such acts may be combined. The illustrated methods 1400, 1430 and other methods of the disclosure may be implemented in hardware, processor-executed software, processor-executed firmware, programmable logic, or combinations thereof, such as in the GFL system 948 in the drives 956, the PLC 944, the processor system 964 or in another processor-implemented device in the system 942, and may be embodied in the form of computer executable instructions stored in a tangible, non-transitory computer readable medium, such as in the electronic memory 992 operatively associated with the processor 990 in the example of FIG. 13. Moreover, although illustrated as being implemented in the PLC 944 and/or in the drive 956, any suitable processor-based system may be used to implement the GFL system 948 for drive self-diagnosis on an individual drive basis and/or for identifying the location of a ground fault in a system 942 having multiple suspected locations. In this regard, the GFL system 948 may be implemented in any suitable processor-equipped system having suitable interconnections to provide commands 999, directly or indirectly, to a plurality of motor drive 956 and which can receive ground fault detection and fault frequency indications 998, directly or indirectly, from various sources, wherein the various concepts of the present disclosure are not limited to implementation in a programmable logic controller, motor drive controller, or in any specific host system.

The motor drive operation in the flow diagram 1400 of FIG. 14 begins with normal drive operation at 1402, with the drive measuring for otherwise obtaining or receiving a neutral-ground signal such as a measured neutral-ground voltage signal or value Vng at 1404. The GFD system 946 in the drive 956 determines an integral INTVng of the neutral-ground voltage Vng and determines at 1406 whether the neutral-ground voltage integral INTVng is within a predefined acceptable range (e.g., TH−≤INTVng≤TH+ as shown in FIG. 12 above). If so (YES at 1406), the process continues at 1404 and 1406. Otherwise (NO at 1406), the ground fault detection system 946 of the motor drive 956 determines that a fault condition exists in the system 942, and determines a neutral-ground voltage signal frequency (fault frequency Fng) at 1408. Any suitable frequency determination techniques may be employed at 1408, including without limitation use of zero crossing detectors, PLLs, firmware algorithms, etc. In certain embodiments, the system 946 determines the fault frequency Fng as a frequency of the integral INTNng at 1408.

A determination is made at 1410 in FIG. 14 as to whether the operating frequency Fdrive of the given drive 956 is within the predefined range including the fault frequency Fng (e.g., Fng+/−ΔF, or other range that includes Fng). In this manner, the ground fault location system 948 determines at 1410 whether the drive 956 is operating at or near (e.g., substantially at) the fault frequency Fng. In one suitable non-limiting example, for instance, the test range at 1410 may be defined in terms of a ΔF value of several Hz (e.g., Fng+/−3 Hz), or as a percentage range around (or at least including) the fault frequency Fng (e.g., Fng+/−2%, between Fng+2% and Fng−1%, etc.). If the drive operating frequency Fdrive is outside the designated range (NO at 1410), the drive 956 exonerates itself as a suspected fault location at 1412, and may optionally report the existence of the detected fault condition, the determined fault frequency Fng and its operating frequency Fdrive to the PLC 944 or to another GFL system 948 in the system 942 at 1413, and the process 1400 returns to 1404 as described above. However, if the drive frequency Fdrive is at or near the fault frequency Fng (YES at 1410), the drive self-diagnoses itself as being the fault source location (or at least a suspect) at 1414 and reports the detected fault, the fault frequency Fng and the drive operating frequency Fdrive at 1416 to the PLC 944 or other GFL system 948. The drive 956 may report its conclusion of fault location identification at 1416, or the receiving GFL system 948 may determine that the sending drive 956 is a suspected fault location based on the reported fault and operating frequencies as described further below.

In the illustrated embodiment, moreover, the drive 956 again assesses the measured neutral-ground voltage at 1418, determines the integral INTNng, and determines whether the neutral-ground voltage integral is within the predefined amplitude range (e.g., TH−≤INTVng≤TH+). If so (YES at 1418), the fault is deemed cleared, and the process returns to 1404. Otherwise (NO at 1418), the drive 956 continues normal operation at 1420 and determines at 1422 whether a speed command change has been requested by the PLC 944. As described further below, the PLC 944 or other GFL system 948 may selectively change or adjust operating speeds (i.e., operating frequencies) of one or more suspected drives 956 in the system 942 by sending a speed command change through network communications in order to identify the ground fault location. If no speed command change is received (NO at 1422), the normal operation continues while monitoring the neutral-ground voltage integral signal amplitude at 1418 and 1420 as previously described. If a speed change is requested (YES at 1422), the drive 956 modifies its operating frequency Fdrive, and determines and reports the fault frequency to the PLC 944 (or other GFL system 948) at 1424. If the PLC confirms that the drive 956 is the fault location (YES at 1426), the drive may perform one or more predetermined actions at 1428 (e.g., controlled shutdown, display fault condition on a user interface, etc.), and otherwise (NO at 1426) returns to again assess the monitored fault signal amplitude at 1418. The drive 956 thus implements local self-diagnosis for assessing whether it is (at least suspected of being) a detected ground fault location within the multi-drive system 942, without interrupting operation of its associated motor and without requiring shutdown of any other drives 956 in the system 942.

FIG. 15 is a flow diagram illustrating an exemplary method 1430 for ground fault location through suspect identification and selective frequency adjustment for drive exoneration or fault location confirmation in one embodiment. The method 1430 may be implemented in the illustrated ground fault location (GFL) system 948, for example, using a processor of a PLC 944, of a motor drive 956, and/or of a separate processor system 964 in certain embodiments. Beginning from normal operation, the GFL system 948 determines at 1432 whether a ground fault has been detected. The GFL system 948 may receive an indication that a ground fault has been detected from an external device via the network 950, for example, from a ground fault detection system 946 located within the multi-drive system 942, or may receive such an indication at 1432 from and on-board ground fault detection system 946. If no fault has been detected (NO at 1432), normal operation continues, and once a fault has been detected (YES at 1432), the GFL system 948 receives or otherwise obtains a fault frequency (e.g., Fng) at 1434 from a ground fault detection system 946 (e.g., implemented in a ground fault detection board 966, or in one or more of the drives 956, in the PLC 944, etc.). In addition, the GFL system 948 receives drive operating frequencies (Fdrive$_i$) from one or more of the drives 956 at 1434, for example, by automatic reporting messaging through the network 950, or by the GFL system 948 sending request messaging to the operating drives 956 in the multi-drive system 942 and receiving corresponding responses individually or jointly reporting the latest operating frequency Fdrive.

At 1436, the GFL system 948 identifies a set or list of "n" suspected drives for which the current operating frequency Fdrive of the motor drive 946 is within a range including the fault frequency Fng. As in the above self-diagnosis operation of the individual drives 956, the GFL system 948 at 1436 determines whether a given drive 956 is operating at or near the fault frequency Fng (e.g., Fng+/−ΔF, Fng+/−2%, between Fng+2% and Fng−1%, etc.). A determination is made at 1438 as to whether the set is empty (n=0) and if so (YES at 1438), the system 948 determines at 1440 whether the fault frequency Fng is near a line frequency of the multi-drive system 942 (e.g., near the fundamental frequency of the AC source 952 in FIGS. 9 and 10 above). If so (YES at 1440), the GFL system 948 identifies a shared AC or DC bus ground fault (e.g., system ground fault) at 1442, and otherwise (NO at 1440) signals a fault for further troubleshooting at 1444.

If there is at least one motor drive 946 operating at or near the fault frequency Fng (NO at 1438), the GFL system 948 determines at 1446 whether only a single drive 956 is suspected (n=1). If so (YES at 1446), the system 948 confirms at 1448 that the detected ground fault is located at the single suspected drive 956.

If more than one drive 956 is suspected (e.g., operating at or near the fault frequency Fng (NO at 1446), the GFL system 948 selects a first suspected drive at 1450 and sends a speed command change, preferably within a system tolerance range (e.g. +/−5% in one embodiment) to the selected drive 956 at 1452 and receives an updated fault frequency Fng$_{NEW}$ (e.g., from the selected drive 956, or from another ground fault detection system 946 in the multi-drive system 942) while any remaining drives 956 in the system 942 can continue operation at their respective current operating frequencies Fdrive. A determination is made at 1454 by the GFL system 948 as to whether the updated ground fault frequency has changed by a predetermined amount (e.g., |Fng$_{OLD}$-Fng$_{NEW}$| is less than a threshold F$_{TH}$). If so (YES at 1454), the system 948 confirms that the detected ground fault is located at the selected drive at 1456. Otherwise (NO at 1454), the GFL system 948 confirms that no fault exists in the selected drive at 1458.

The GFL system 948 then determines at 1460 whether the selected drive 956 is the last suspect, and if so (YES) proceeds to analyze whether the fault frequency Fng is near the line frequency at 1440 and selectively identifies a system ground fault at 1442 if so, as described above. Otherwise (NO at 1460), the GFL system 948 selects the next suspected drive in the set at 1452 and returns to 1452-1458 to assess whether the newly selected suspect drive 956 is the source of the detected ground fault through selective operating frequency adjustment and reassessment of the fault frequency while the other drives 956 continue operation at their corresponding designated operating frequencies as described above. In this manner, the ground fault location system 948 (whether implemented in a PLC 944, in a motor drive 956, or in a separate processor-based system 966) advantageously performs automatic system diagnosis to identify whether an operating motor drive 956 is the location or cause of a detected high resistance ground fault in the multi-drive system 942 without disturbing operation of the running drives 956. In this regard, the selective adjustment of the operating frequency of a selected drive 956 (at 1452 in FIG. 15) is preferably done such that the selected drive continues to operate within a designated system tolerance range around the desired command speed for that drive. In this manner, even the selected drive 956 which is being analyzed at any given time is still operating within acceptable limits. Thus, the ground fault location concepts disclosed in the described embodiments advantageously reduce system downtime and mitigate excessive manual troubleshooting in multi-drive systems 942 to expeditiously identify the source or location of a high resistance ground fault while minimizing cost.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense. Also, the terms "couple", "couples", or "coupled" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

The following is claimed:

1. An apparatus to sense a time-varying system voltage indicative of a leakage flux linkage to detect system ground faults in a power conversion system, comprising:
    a first coupling capacitor, including a first terminal connected to a DC bus circuit of a power conversion system, and a second terminal;
    a voltage divider circuit, including a plurality of resistors connected in series with one another between the second terminal of the first coupling capacitor and a reference node, and an output node that delivers a voltage signal corresponding to a voltage of the first terminal of the coupling capacitor, the coupling capacitor and the voltage divider circuit presenting a DC resistance to the DC bus circuit relative to a reference node;
    a second coupling capacitor including a first terminal connected to the DC bus circuit, and a second terminal connected to the voltage divider circuit;
    wherein the plurality of resistors are connected in series with one another between the second terminals of the first and second coupling capacitors and the reference node;
    a signal conditioning circuit, including an input coupled to receive the voltage signal from the output node of the voltage divider circuit, and an output to provide an output voltage signal representing the voltage signal from the output node;
    an analog-to-digital converter, including an input coupled with the output of the signal conditioning circuit, the analog-to-digital converter operative to provide digital values corresponding to the output voltage signal; and
    a processor configured to determine a leakage flux linkage based on the digital values, and to detect ground faults in the power conversion system based at least partially on the leakage flux linkage.

2. The apparatus of claim 1, wherein the apparatus presents a DC resistance greater than 100 MΩ to the DC bus circuit relative to the reference node.

3. The apparatus of claim 1, wherein the coupling capacitor has a voltage rating greater than 2500 V.

4. The apparatus of claim 1, wherein the coupling capacitor has a single digit nF capacitance value.

5. The apparatus of claim 1, wherein the first terminal of the first coupling capacitor is connected to a first DC bus terminal, and wherein the first terminal of the second coupling capacitor is connected to a second DC bus terminal.

6. The apparatus of claim 5, wherein the plurality of resistors provide a total series resistance of 1-2 MΩ.

7. The apparatus of claim 1, wherein the plurality of resistors provide a total series resistance of 1-2 MΩ.

8. The apparatus of claim 1, wherein the processor is configured to detect ground faults in the power conversion system based on an amplitude of the leakage flux linkage, a frequency of the leakage flux linkage, or a phase shift angle of the leakage flux linkage.

* * * * *